United States Patent
Tseng

(10) Patent No.: US 9,362,951 B2
(45) Date of Patent: Jun. 7, 2016

(54) DECODING METHOD, DECODING CIRCUIT, MEMORY STORAGE DEVICE AND CONTROLLING CIRCUIT UNIT

(71) Applicant: PHISON ELECTRONICS CORP., Miaoli (TW)

(72) Inventor: Chien-Fu Tseng, Yunlin County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 108 days.

(21) Appl. No.: 14/145,989

(22) Filed: Jan. 1, 2014

(65) Prior Publication Data

US 2015/0113353 A1    Apr. 23, 2015

(30) Foreign Application Priority Data

Oct. 22, 2013    (TW) .............................. 102138141 A

(51) Int. Cl.
  *G11C 29/00*    (2006.01)
  *H03M 13/11*   (2006.01)
  *G06F 11/10*    (2006.01)

(52) U.S. Cl.
  CPC ....... *H03M 13/1105* (2013.01); *G06F 11/1012* (2013.01); *H03M 13/1108* (2013.01); *H03M 13/1111* (2013.01); *H03M 13/1117* (2013.01)

(58) Field of Classification Search
  CPC ..................... H03M 13/1105; H03M 13/1108; H03M 13/1111; H03M 13/1117; G06F 11/10; G06F 11/1012
  See application file for complete search history.

(56) References Cited

U.S. PATENT DOCUMENTS

| 2012/0005552 A1 | 1/2012 | Gunnam | |
| 2013/0173985 A1* | 7/2013 | Chung et al. | 714/755 |
| 2014/0164867 A1* | 6/2014 | Kaynak et al. | 714/763 |

OTHER PUBLICATIONS

Author: Tian Xia, Hsiao-Chun Wu, and Scott C.-H. Huang; Title: A New Stopping Criterion for Fast Low-Density Parity-Check Decoders; Publisher: Globecom 2013—Wireless Communications Symposium, 978-1-4799-1353-4/13 © 2013 IEEE.*
Tanakamaru et al., "Highly reliable solid-state drives (SSDs) with eror-prediction LDPC (EP-LDPC) architecture and error-recovery scheme", Design Automation Conference (ASP-DAC), 2013 18th Asia and South Pacific, Jan. 22-25, 2013, pp. 83-84.
"Office Action of Taiwan Counterpart Application", issued on Oct. 19, 2015, p. 1-p. 7.

* cited by examiner

*Primary Examiner* — April Y Blair
*Assistant Examiner* — Thien D Nguyen
(74) *Attorney, Agent, or Firm* — Jianq Chyun IP Office

(57) ABSTRACT

A decoding method, a memory storage device, a memory controlling circuit unit and a decoding circuit for low density parity code (LDPC) are provided. The decoding method includes: reading a data bit of each memory cell; performing a parity check procedure on the data bits to generate a plurality of checks; in an iterative decoding of LDPC, obtaining a reliability message of each data bit according to the checks and deciding an index of an error bit from the data bits according to the reliability messages; determining whether the index of the error bit and the checks comply with a parity criteria; and if the index of the error bit and the checks comply with the parity criteria, stopping the iterative decoding and outputting the index of the error bit. Accordingly, a decoding latency is decreased.

30 Claims, 15 Drawing Sheets

DECODING METHOD, DECODING CIRCUIT, MEMORY STORAGE DEVICE AND CONTROLLING CIRCUIT UNIT

CROSS-REFERENCE TO RELATED APPLICATION

This application claims the priority benefit of Taiwan application serial no. 102138141, filed on Oct. 22, 2013. The entirety of the above-mentioned patent application is hereby incorporated by reference herein and made a part of this specification.

BACKGROUND

1. Technical Field

The invention relates to a decoding method, and more particularly, to a decoding method, a memory storage device, a memory controlling circuit unit and a decoding circuit for a low density parity code.

2. Description of Related Art

The markets of digital cameras, cellular phones, and MP3 players have expanded rapidly in recent years, resulting in escalated demand for storage media by consumers. The characteristics of data non-volatility, low power consumption, and compact size make the rewritable non-volatile memory module (e.g., flash memory) ideal for being built in the portable multi-media devices as cited above.

Generally, some error correcting codes are usually added to data stored in the rewritable non-volatile memory module. The error correcting codes in conventional art usually adopts an algebraic decoding algorithm such as BCH code, in which a correcting capability is limited. At present days, a probabilistic decoding algorithm under development such as a low density parity code (LDPC) is gradually mature to include a more preferable correcting capability. However, when a decoding is performed by using the low density parity code, an entire codeword needs to be entered, and a result from the decoding is going to be the entire codeword accordingly. In some implementations, inputting and outputting the entire codeword may increase a decoding latency to expand demands for bandwidth of a buffer memory. Therefore, how to decrease the decoding latency for the low density parity code is one of the major subjects for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a decoding method, a memory storage device, a memory controlling circuit unit and a decoding circuit for a low density parity code, and capable of decreasing a decoding latency.

A decoding method for low density parity code is provided according to an exemplary embodiment of the invention, which is used in a rewritable non-volatile memory module. The rewritable non-volatile memory module may include a plurality of first memory cells. The decoding method includes: reading a data bit of each of the first memory cells; performing a parity check procedure on the data bits to generate a plurality of checks; in an iterative decoding of LDPC, obtaining a reliability message of each data bit according to the checks and deciding an index of an error bit from the data bits according to the reliability messages; determining whether the index of the error bit and the checks comply with a parity criteria; and if the index of the error bit and the checks comply with the parity criteria, stopping the iterative decoding, and correcting the data bit according to the index of the error bit.

A memory storage device is provided according to an exemplary embodiment of the invention, and includes a connection interface unit, the rewritable non-volatile memory module described above and a memory controlling circuit unit. The connection interface unit is configured to couple to a host system. The memory controlling circuit unit is coupled to the connection interface unit and the rewritable non-volatile memory module, and configured to execute a plurality of steps that include: reading a data bit of each of the first memory cells; performing a parity check procedure on the data bits to generate a plurality of checks; in an iterative decoding of the low density parity code, obtaining a reliability message of each of the data bits according to the checks, and deciding an index of an error bit from the data bits according to the reliability messages; determining whether the index of the error bit and the checks comply with a parity criteria; and if the index of the error bit and the checks comply with the parity criteria, stopping the iterative decoding, and correcting the data bit according to the index of the error bit.

A memory controlling circuit unit is provided according to an exemplary embodiment of the invention, and configured to control the rewritable non-volatile memory module described above. The memory controlling circuit unit includes a host interface, a memory interface, a memory management circuit and an error checking and correcting circuit. The host interface is configured to couple to a host system. The memory interface is configured to couple to the rewritable non-volatile memory module. The memory management circuit is coupled to the host interface and the memory interface, and configured to read a data bit of each of the first memory cells. The error checking and correcting circuit is configured to perform a plurality of steps that include: performing a parity check procedure on the data bits to generate a plurality of checks; in an iterative decoding of the low density parity code, obtaining a reliability message of each of the data bits according to the checks, and deciding an index of an error bit from the data bits according to the reliability messages; determining whether the index of the error bit and the checks comply with a parity criteria; and if the index of the error bit and the checks comply with the parity criteria, stopping the iterative decoding, and correcting the data bit according to the index of the error bit.

A decoding circuit for low density parity code is provided according to an exemplary embodiment of the invention, which is used in the rewritable non-volatile memory module described above. The decoding circuit for low density parity code includes a checking circuit, an error bit index generating circuit and a correcting circuit. The checking circuit is configured to receive the data bits, and perform a parity check procedure on the data bits to generate a plurality of checks. The error bit index generating circuit is coupled to the checking circuit, and configured to obtain a reliability message of each of the data bits according to the checks, and decide an index of at least one error bit from the data bits according to the reliability messages. The correcting circuit is coupled to the error bit index generating circuit, and configured to correct the data bit according to the index of the error bit.

Based on above, a decoding method, a memory storage device, a memory controlling circuit unit and a decoding circuit for a low density parity code according to the exemplary embodiments of the invention are capable of performing the iterative decoding according to the checks, in which the iterative decoding outputs the index of the error bit. Accordingly, a decoding latency is decreased.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
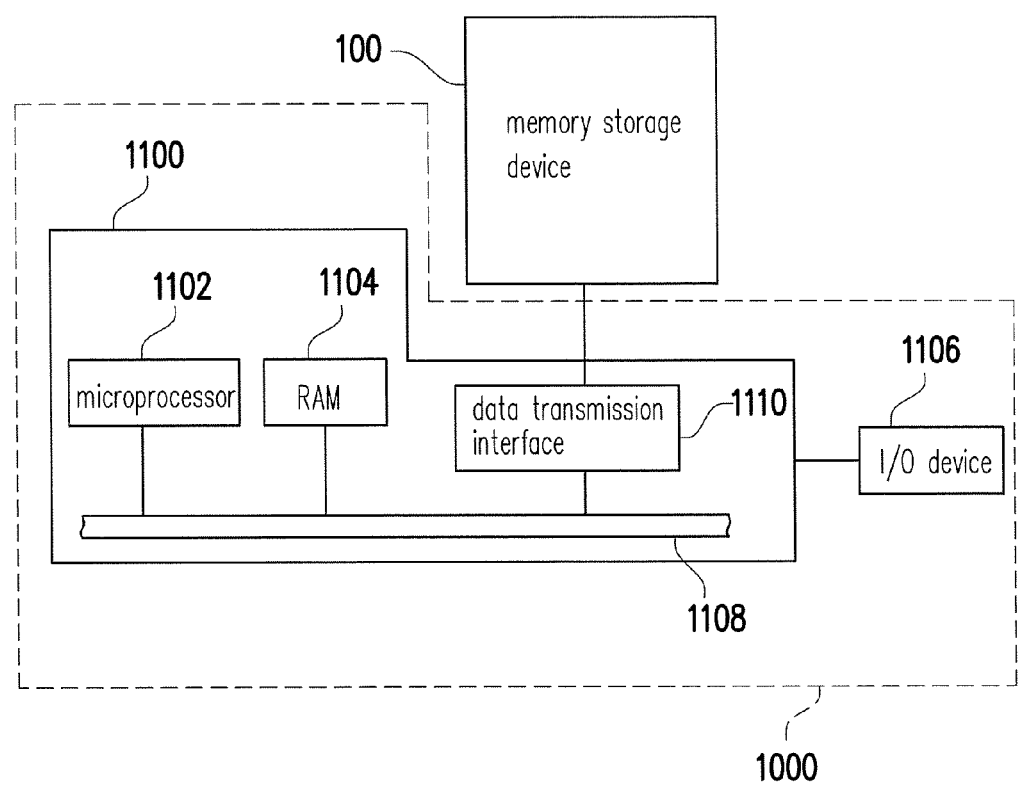
FIG. 1 illustrates a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
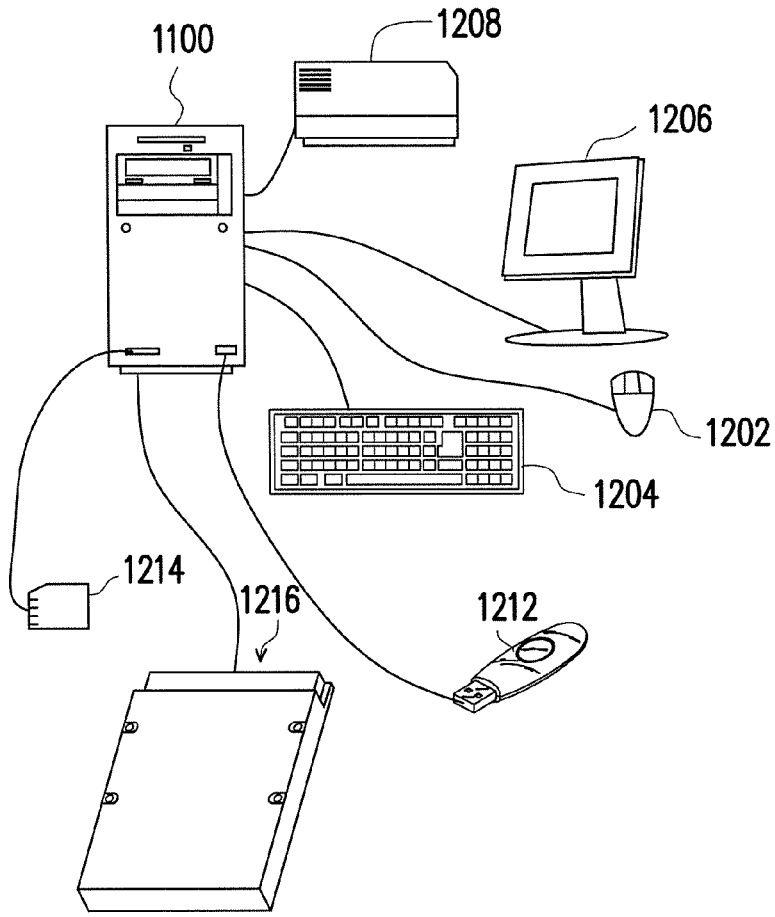
FIG. 2 is a schematic diagram illustrating a computer, an input/output device and a memory storage device according to an exemplary embodiment.

FIG. 1 illustrates a host system and a memory storage device according to an exemplary embodiment. FIG. 2 is a schematic diagram illustrating a computer, an input/output device and a memory storage device according to an exemplary embodiment.

Referring to FIG. 1, a host system 1000 includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In the embodiment of the invention, the memory storage device 100 is coupled to the devices of the host system 1000 through the data transmission interface 1110. By using the microprocessor 1102, the random access memory (RAM) 1104 and the Input/Output (I/O) device 1106, data may be written to the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 2.

Figure 3:
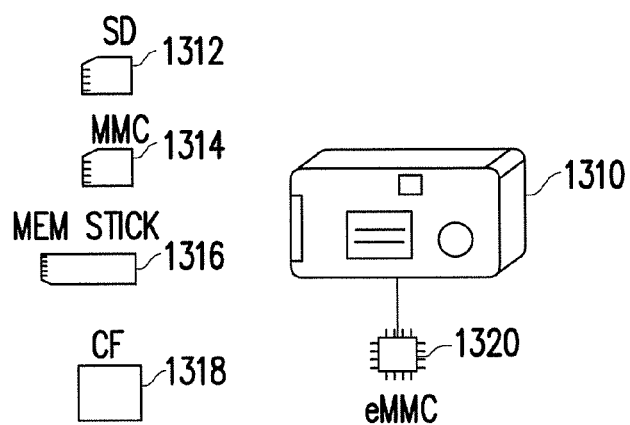
FIG. 3 is a schematic diagram of a host system and a memory storage device according to an exemplary embodiment.

FIG. 3 is a schematic diagram of a host system and a memory storage device according to an exemplary embodiment.

Generally, the host system 1000 may substantially be any system capable of storing data with the memory storage device 100. Although the host system 1000 is described as a computer system in the present exemplary embodiment, in another exemplary embodiment of the invention, the host system 1000 may be a digital camera, a video camera, a telecommunication device, an audio player, or a video player. For example, if the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 3). The embedded storage device 1320 includes an embedded MMC (eMMC). It should be mentioned that the eMMC is directly coupled to a substrate of the host system.

Figure 4:
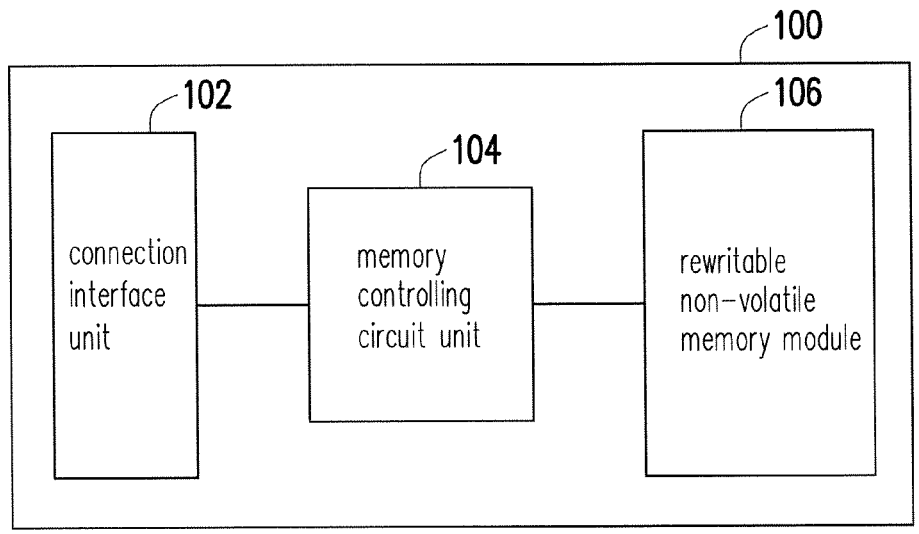
FIG. 4 is a schematic block diagram illustrating a memory storage device according to first exemplary embodiment.

FIG. 4 is a schematic block diagram of the memory storage device in FIG. 1.

Referring to FIG. 4, the memory storage device 100 includes a connection interface unit 102, a memory controlling circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory controlling circuit unit 104 may be packaged into one chip, or the connection interface unit 102 is distributed outside of a chip containing the memory controlling circuit unit 104.

The memory controlling circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host 1000.

The rewritable non-volatile memory storage module 106 is coupled to the memory controlling circuit unit 104 and configured to store data written from the host system 1000. The rewritable non-volatile memory module 106 may be a Single Level Cell (SLC) NAND flash memory module, a Multi Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Figure 5:
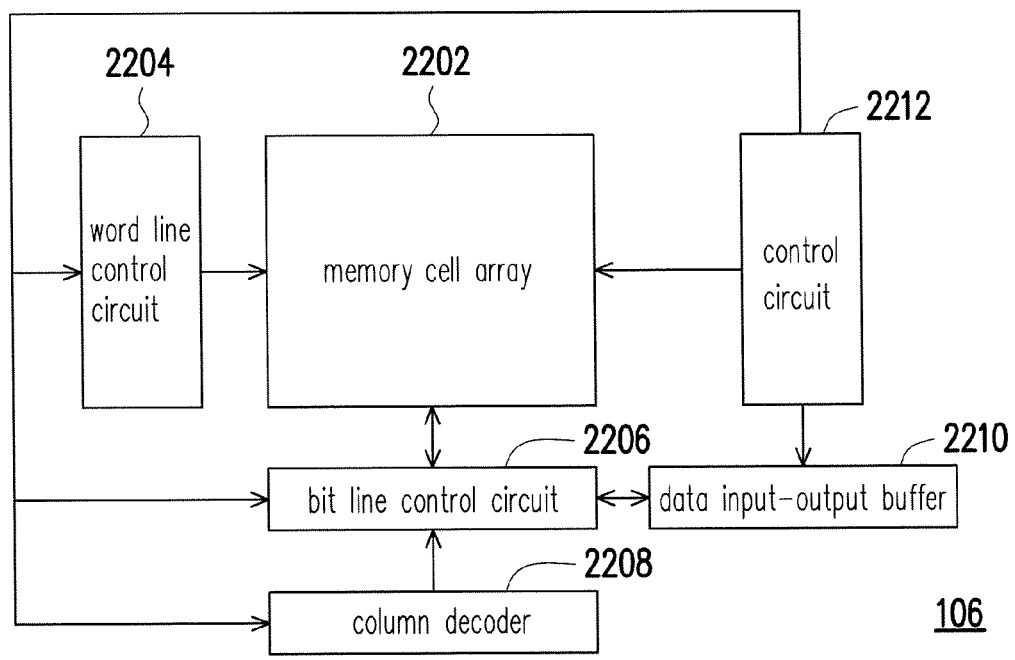
FIG. 5 is a schematic block diagram illustrating a rewritable non-volatile memory module according to an exemplary embodiment.
Figure 6:
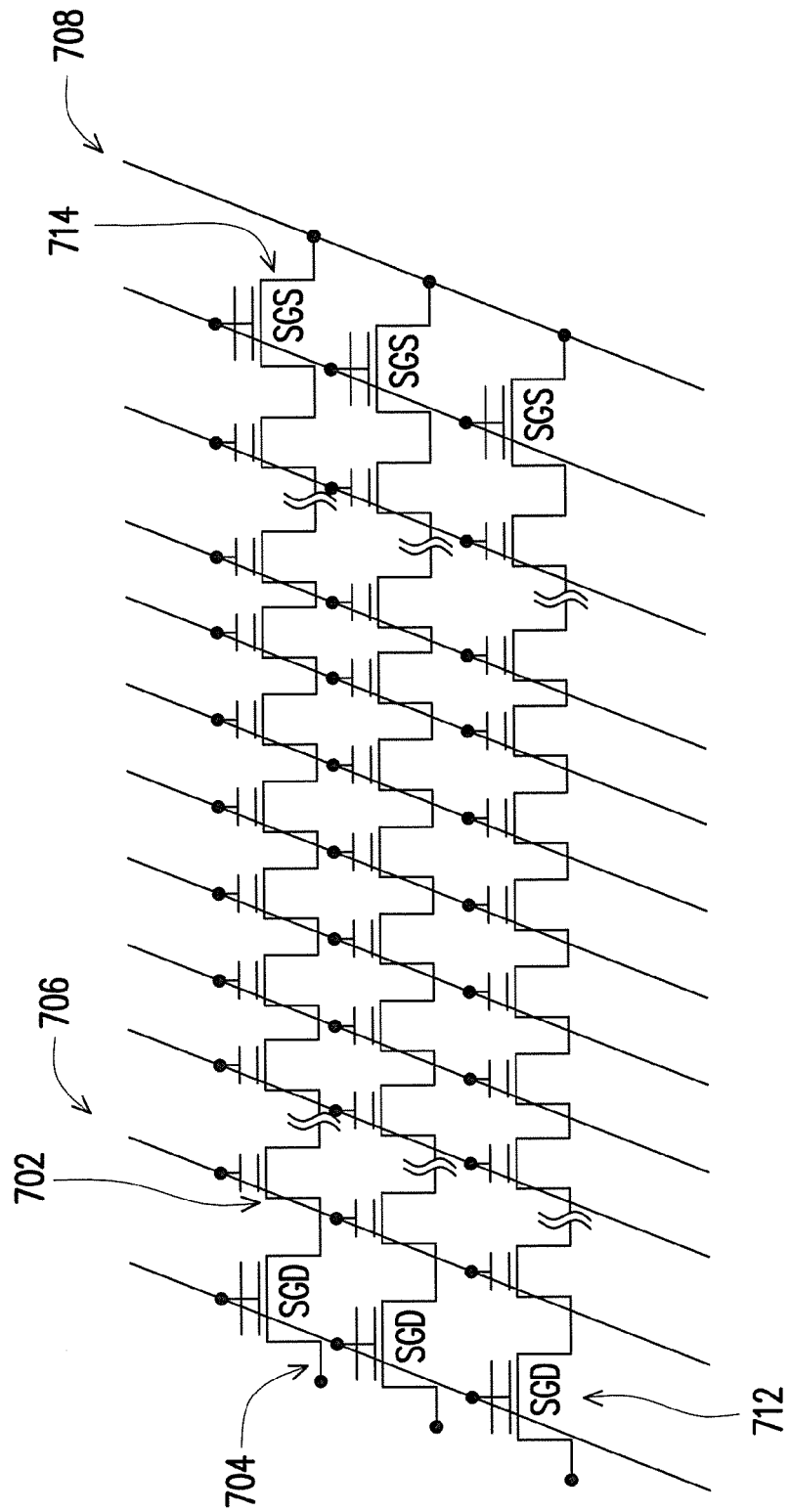
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5, the rewritable non-volatile memory module 106 includes a memory cell array 2202, a word line control circuit 2204, a bit line control circuit 2206, a column decoder 2208, a data input-output buffer 2210 and a control circuit 2212.

The memory cell array 2202 includes a plurality of memory cells 702 used to store data, a plurality of select gate drain (SGD) transistors 712, a plurality of select gate source (SGS) transistors 714, as well as a plurality of bit lines 704, a plurality of word lines 706, a common source line 708 connected to the memory cells (as shown in FIG. 6). The memory cell 702 is disposed at intersections of the bit lines 704 and the word lines 706 in a matrix manner (or in a 3D stacking manner). In case a write command or a read command is received from the memory controlling circuit unit 104, the control circuit 2212 controls the word line control circuit 2204, the bit line control circuit 2206, the column decoder 2208, the data input-output buffer 2210 to write the data in the memory cell array 2202 or read the data from the memory cell array 2202. Therein, the word line control circuit 2204 is configured to control voltages applied to the word lines 706; the bit line control circuit 2206 is configured to control voltages applied to the bit lines 704; the column decoder 2208 is configured to select the corresponding bit line according to a row address in a command; and the data input-output buffer 2210 is configured to temporarily store the data.

The memory cell in the rewritable non-volatile memory module 106 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This procedure of changing the threshold voltage is also referred to as "writing data into the memory cell" or "programming the memory cell". Each of the memory cells in the memory cell array 2022 has a plurality of storage statuses depended on changes in the threshold voltage. Moreover, which of the storage statuses is the memory cell belong to may be determined through read voltages, so as to obtain the bits stored in the memory cell.

Figure 7:
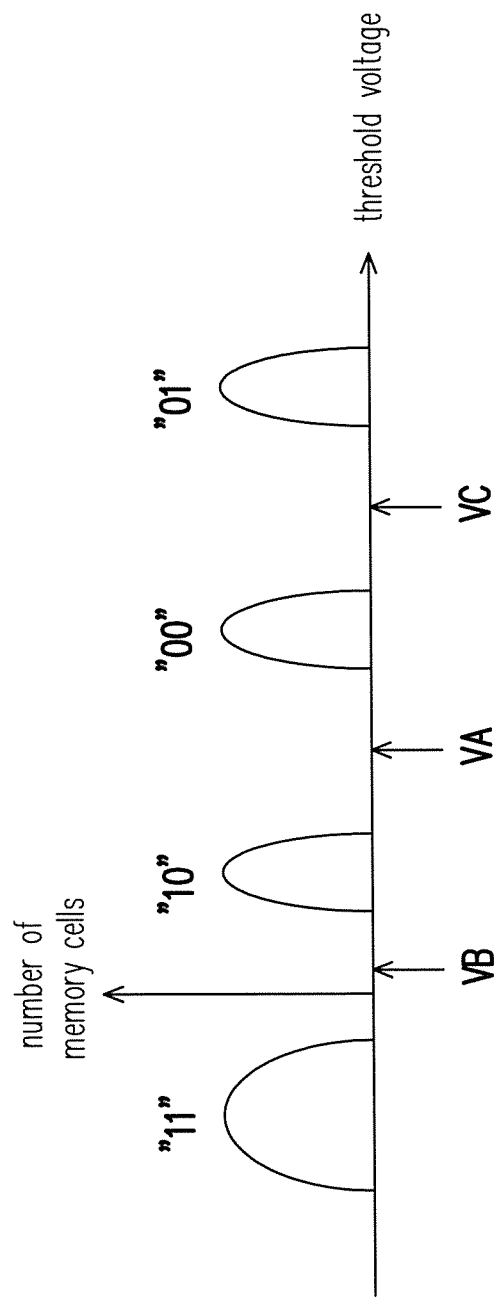
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage statuses depended on different threshold voltages, and the statuses represent bits "11", "10", "00" and "01", respectively. In other words, each of the statuses includes a least significant bit (LSB) and a most significant bit (MSB). In the present exemplary embodiment, a first bit counted from the left in the statuses (i.e., "11", "10", "00" and "01") is the LSB, and a second bit counted from the left is the MSB. Accordingly, in this exemplary embodiment, each of the memory cells may store two bits. It should be understood that, the storage statuses corresponding to the threshold voltage as illustrated in the FIG. 7 are merely an example. In another exemplary embodiment of the invention, the storage statuses corresponding to the threshold voltage may also have an arrangement of "11", "10", "01" and "00" that is arranged according to the threshold voltage from small to large, or other arrangements. In addition, in another exemplary embodiment, it can also be defined that the first bit counted from the left is the MSB, and the second bit counted from the left is the LSB.

Figure 8:
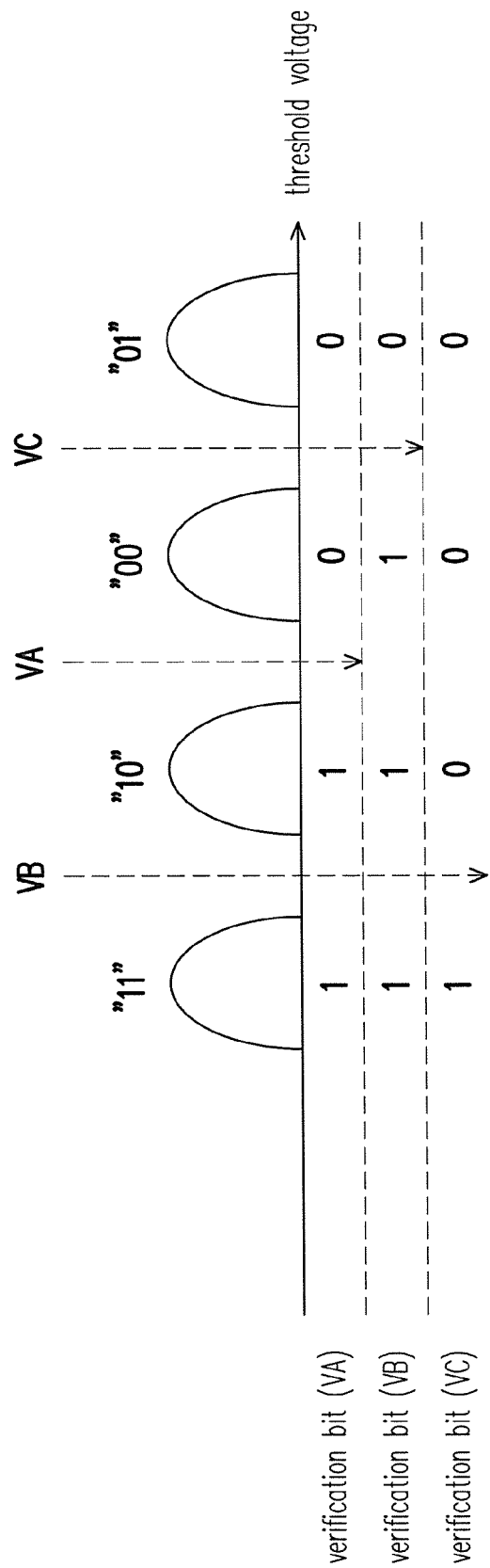
FIG. 8 illustrates a schematic diagram of reading data from a memory cell according to an exemplary embodiment.

FIG. 8 illustrates a schematic diagram of reading data from a memory cell according to an exemplary embodiment, which uses a MLC NAND flash memory for example.

Referring to FIG. 8, in a reading operation for the memory cells of the memory cell array 2202, the read voltage is applied to the control gate, and data stored in the memory cells are identified according to whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. It is assumed that the corresponding channel of the memory cell being turned on is indicated by the verification bit being "1", and the corresponding channel of the memory cell not being turned on is indicated by the verification bit being "0". As shown in FIG. 8, which of the storage statuses the memory cell is in may be determined according to the verification bits (VA) to (VC), thereby obtaining the bits being stored.

Figure 9:
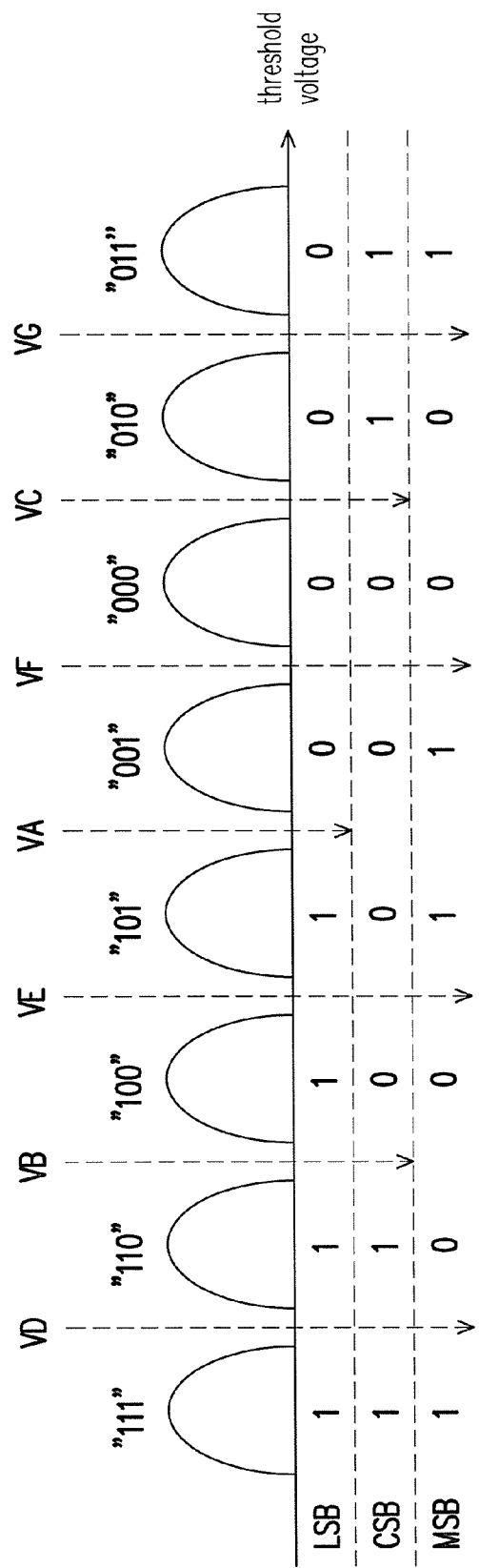
FIG. 9 illustrates a schematic diagram of reading data from a memory cell array according to another exemplary embodiment.

FIG. 9 illustrates a schematic diagram of reading data from a memory cell array according to another exemplary embodiment.

Referring to FIG. 9 which takes the TLC NAND flash memory for example, each of the storage statues includes a first bit counted from the left being the least significant bit (LSB), a second bit counted from the left being a center significant bit (CSB) and a third bit counted from the left being the most significant bit (MSB). In this embodiment, the memory cell includes eight storage statuses depended on different threshold voltages (i.e., "111", "110", "100", "101", "001", "000", "010" and "011"). The bits stored in the memory cell may be identified by applying the read voltages VA to VC to the control gate.

Figure 10:
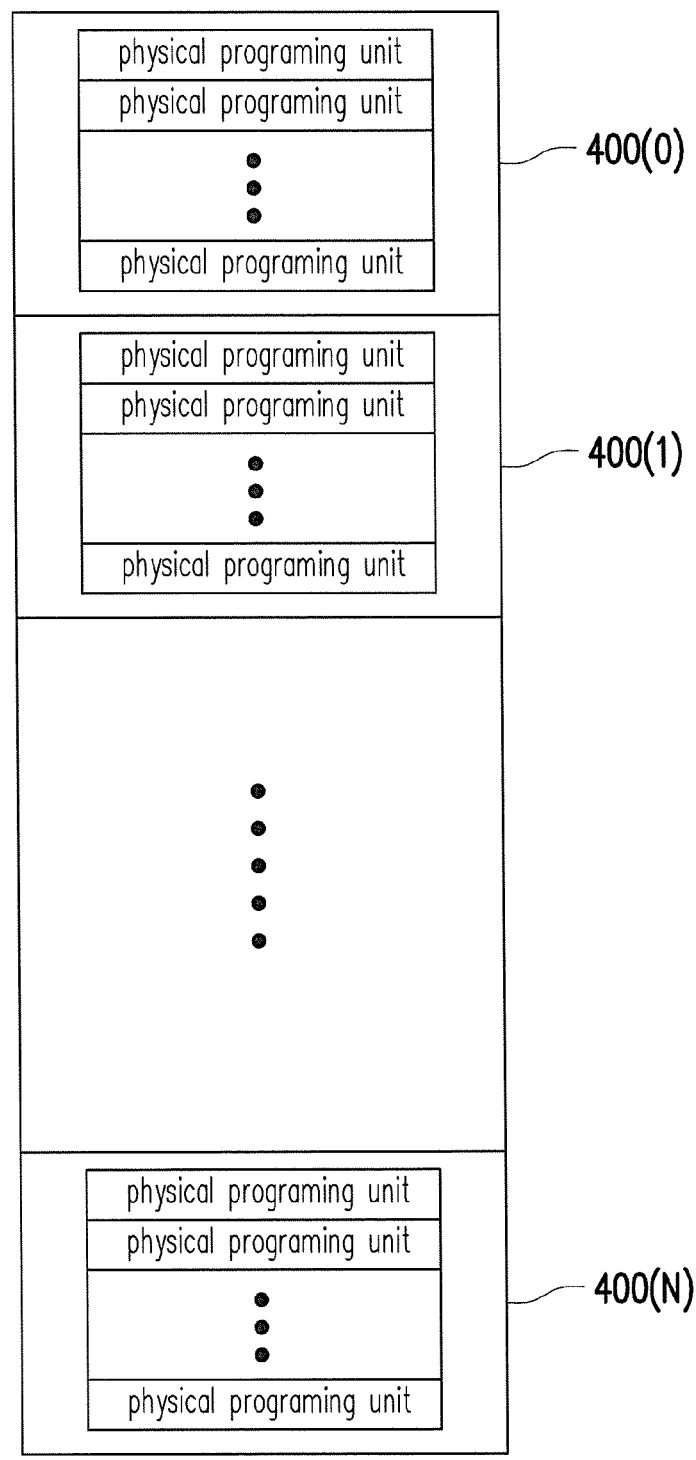
FIG. 10 is a schematic diagram illustrating management of a rewritable non-volatile memory module according to an exemplary embodiment of the invention.

FIG. 10 is a schematic diagram illustrating management of a rewritable non-volatile memory module according to an exemplary embodiment of the invention.

Referring to FIG. 10, the memory cells 702 of the rewritable non-volatile memory module 106 constitute a plurality of physical programming units, and the physical programming units constitutes a plurality of physical erasing units 400(0) to 400(N). More specifically, the memory cells on the same word line are grouped into one or more physical programming units. In case each of the memory cells may store more than or equal to two bits, the physical programming units on the same word line may be classified into a lower physical programming unit and an upper physical programming unit. For instance, the LSB of each memory cell is the lower physical programming unit, and the MSB of each memory cell is the upper physical programming unit. Generally, a writing speed of the lower physical programming unit is faster than a writing speed of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention. On the other hand, the physical erase unit is the minimal unit for erasing. Namely, each physical erasing unit contains the least number of memory cells to be erased together. For instance, the physical erasing unit is a physical block.

Figure 11:
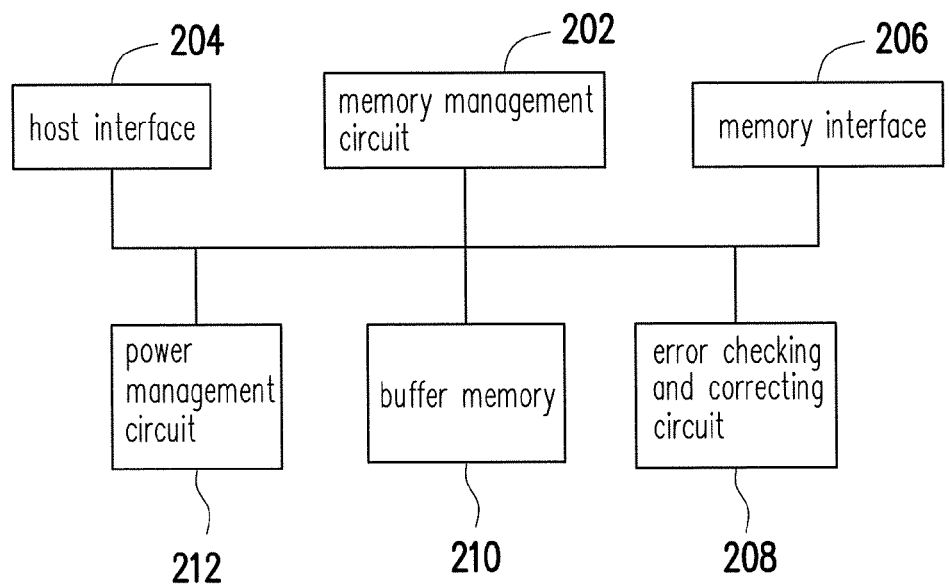
FIG. 11 is a schematic block diagram illustrating a memory controlling circuit unit according to an exemplary embodiment.

FIG. 11 is a schematic block diagram illustrating a memory controlling circuit unit according to an exemplary embodiment. It should be understood that, the structure of the memory controlling circuit unit depicted in FIG. 11 is only an example, and the invention is not limited thereto.

Referring to FIG. 11, the memory controlling circuit unit 104 includes a memory management circuit 202, a host interface 204, a memory interface 206 and an error checking and correcting circuit 208.

The memory management circuit 202 is configured to control overall operations of the memory controlling circuit unit 104. Specifically, the memory management circuit 202 has a plurality of control commands. When the memory storage device 100 operates, the control commands are executed to perform various operations such as data writing, data reading and data erasing. Operations of the memory management circuit 202 are similar to the operations of the memory controlling circuit unit 104, thus related description is omitted hereinafter.

In the present exemplary embodiment, the control commands of the memory management circuit 202 are implemented in a form of a firmware. For example, the memory management circuit 202 has a microprocessor unit (not illustrated) and a ROM (not illustrated), and the control commands are burned into the ROM. When the memory storage device 100 is operated, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). In particular, the ROM has an activate code, which is executed by the microprocessor unit to load the control commands stored in the rewritable non-volatile memory module 106 to the RAM of the memory management circuit 202 when the memory controlling circuit unit 104 is enabled. Next, the control commands are executed by the microprocessor unit to perform operations of writing, reading or erasing data.

Further, in another exemplary embodiment of the invention, the control commands of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured for managing the physical blocks of the rewritable non-volatile memory module 106; the memory writing circuit is configured for issuing a write command to the rewritable non-volatile memory module 106 in order to write data into the rewritable non-volatile memory module; the memory reading circuit is configured for issuing a read command to the rewritable non-volatile memory module 106 in order to read data from the rewritable non-volatile memory module 106; the memory erasing circuit is configured for issuing an erase command to the rewritable non-volatile memory module 106 in order to erase data from the rewritable non-volatile memory module 106; the data processing circuit is configured for processing both the data to be written into the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

The error checking and correcting circuit 208 is coupled to the memory management circuit 202 and configured to perform an error checking and correcting process to ensure the correctness of data. Specifically, when the memory management circuit 202 receives the write command from the host system 1000, the error checking and correcting circuit 208 generates an error correcting code (ECC) or an error detecting code (EDC) for data corresponding to the write command, and the memory management circuit 202 writes data and the ECC or the EDC corresponding to the write command to the rewritable non-volatile memory module 106. Subsequently, when the memory management circuit 202 reads the data from the rewritable non-volatile memory module 106, the corresponding ECC or the EDC is also read from the rewritable non-volatile memory module 106, and the error checking and correcting circuit 208 executes the error checking and correcting procedure for the read data based on the ECC or the EDC. In the present exemplary embodiment, a low density parity code (LDPC) is used by the error checking and correcting circuit 208.

In an exemplary embodiment of the invention, the memory controlling circuit unit 104 further includes a buffer memory 210 and a power management circuit 212. The buffer memory 210 is coupled to the memory management circuit 202 and configured to temporarily store data and commands from the host system 1000 or data from the rewritable non-volatile memory module 106. The power management unit 212 is coupled to the memory management circuit 202 and configured to control the power of the memory storage device 100.

Figure 12:
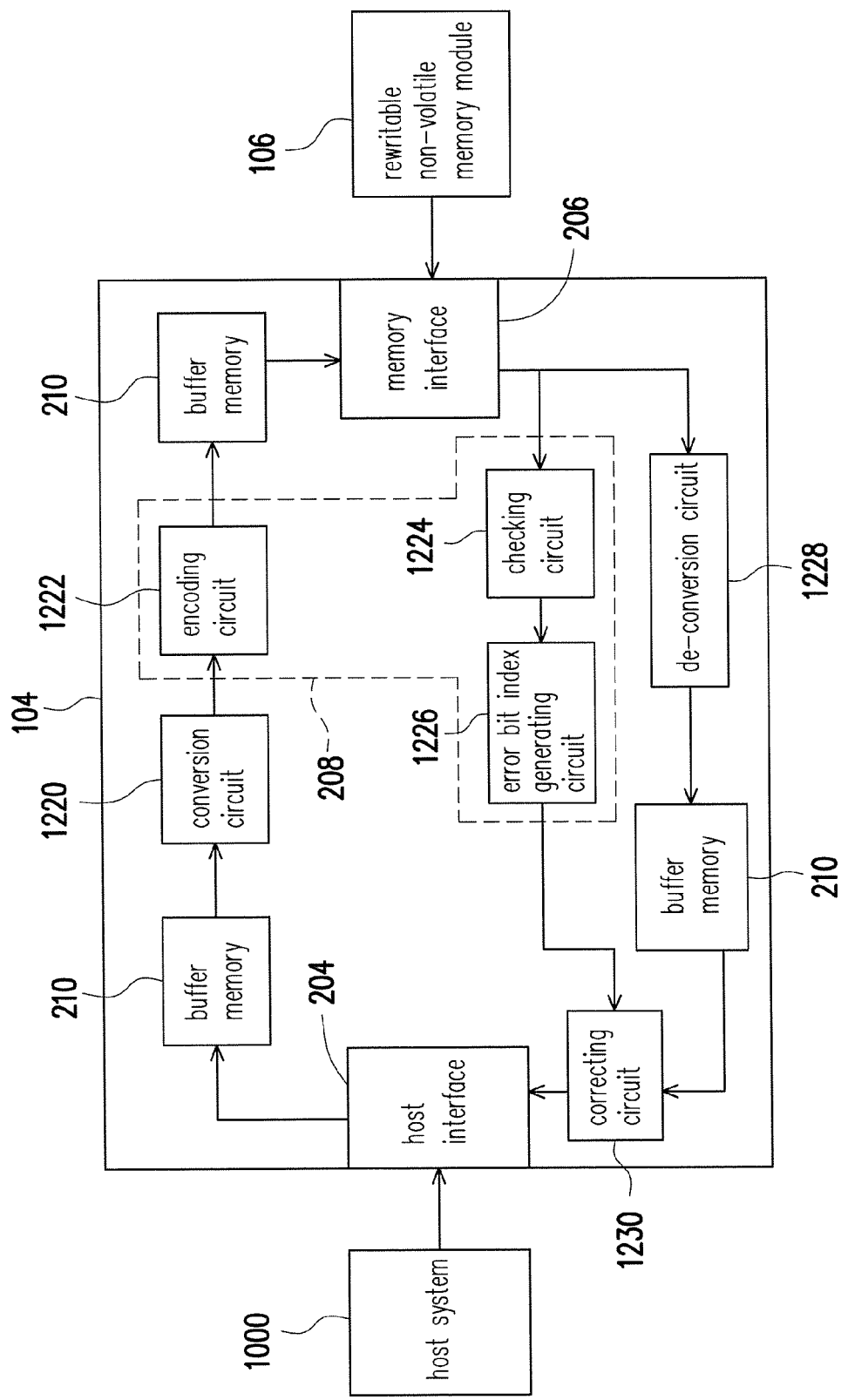
FIG. 12 is a schematic diagram illustrating operations of a memory controlling circuit unit according to first exemplary embodiment.

FIG. 12 is a schematic diagram illustrating operations of a memory controlling circuit unit according to first exemplary embodiment. It should be noted that, circuits in the memory controlling circuit unit 104 are not all illustrated in FIG. 12. Furthermore, three buffer memories 210 as depicted in FIG. 12 may be referred to the same one, and FIG. 12 is used to explain data are temporarily stored in the buffer memory 210 first at which stage. In addition, in the present exemplary embodiment, the error checking and correcting circuit 208 further includes an encoding circuit 1222, a checking circuit 1224 and an error bit index generating circuit 1226.

Referring to FIG. 12, the data from the host system 1000 may be transmitted to the buffer memory 210 through the host interface 204, and then transmitted to a conversion circuit 1220. The conversion circuit 1220 may rearrange the received bits according to an algorithm. For instances, the conversion circuit 1220 may change the bits arranged in sequence into the bits arranged randomly. Next, the encoding circuit 1222 may receive the bits being rearranged, so as to generate the corresponding error correcting code. The bits after being rearranged and the error correcting code being generated may be stored in the buffer memory 210 first, and the memory management circuit 202 may write said bits and the error correcting code into the rewritable non-volatile memory module 106 through the memory interface 206.

After a read command is issued from the host system 1000 to the memory controlling circuit unit 104, the memory management circuit 202 may read a plurality of data bits from a first memory cell of the rewritable non-volatile memory module 106. The data bits are corresponding to one identical codeword. The first memory cell may belong to the same physical programming unit or different physical programming units, and the memory management circuit 202 may read one or more data bits from each of the first memory cells, and the invention is not limited thereto. The data bits being read is then transmitted to the checking circuit 1224, and the checking circuit 1224 may perform a parity check procedure on the data bits to generate a plurality of checks. Generally, the number of the checks is less than the number of the data bits. The checks are then transmitted to the error bit index generating circuit 1226 for performing an iterative decoding of the low density parity code. In the iterative decoding, the error bit index generating circuit 1226 may obtain a reliability message of each of the data bits according to the checks, and calculate an index of at least one error bit from the data bits according to the reliability messages. The error bit index generating circuit 1226 may further determine whether the index of the error bit and the checks comply with parity criteria. If the parity criteria are complied with, the error bit index generating circuit 1226 stops the iterative decoding and outputs the index of the error bit. Or, if the number of iteration in the iterative decoding already exceeds a preset number of iterations, the error bit index generating circuit 1226 may also stop the iterative decoding.

On the other hand, the data bits read from the rewritable non-volatile memory module 106 may be transmitted to a de-conversion circuit 1228. The de-conversion circuit 1228 may rearrange the data bits according to an algorithm, such as changing the data bits arranged randomly into the data bits arranged in sequence. The data bits being rearranged may be temporarily stored in the buffer memory 210 first. A correcting circuit 1230 may correct the data bits being rearranged according to the index of the error bit. For instance, the correcting circuit 1230 includes an exclusive or (XOR) gate configured to perform an exclusive calculation on the error bit and the bit "1", so as to correct (reverse) the error bit. Or, the correcting circuit 1230 may also generate a correcting vector according to the index of the error bit, and the correcting vector includes bits having an amount identical to an amount of the data bits. The correcting circuit 1230 may set a bit in the correcting vector corresponding to the error bit to "1", and set the rest of the bits therein to "0". Next, the correcting circuit 1230 may perform the exclusive calculation on the correcting vector and a vector generated by the data bits, so as to correct the error bit. A method for the correcting circuit 1230 to correct the data bits is not particularly limited in the invention. Lastly, the data bits after being corrected is transmitted to the host system 1000 through the host interface 204.

In another exemplary embodiment, the conversion circuit 1220 and the de-conversion circuit 1228 may also be omitted. Therefore, the correcting circuit 1230 may correct the data bits read from the rewritable non-volatile memory module 106 directly according to the index of the error bit.

In FIG. 12, in particularly, the error bit index generating circuit 1226 uses the checks to perform the iterative decoding instead of all the data bits in the codeword, thus a time for the error bit index generating circuit 1226 to receive the data may be reduced. On the other hand, the error bit index generating circuit 1226 generates the index of the error bit instead of the codeword, and a time required for outputting the index is less a time required for outputting the codeword. Exemplary embodiments are further provided below and served to describe computing processes of iterative decoding when adopting different algorithms. However, regardless of which algorithm is adopted, the checks are used to update a reliability message of one data bit, and the index of the error bit is obtained according to the reliability messages.

Second Exemplary Embodiment

In second exemplary embodiment, when the memory management circuit 202 reads the data bits from rewritable non-volatile memory module 106, a plurality of read voltages are used to obtain a plurality of verification bits form each of the first memory cells, in which one read voltage is corresponding to one of the verification bits. The verification bits may be used to decide the data bit, or may be used to obtain a channel reliability message. The iterative decoding preformed in case each of the memory cells includes multiple verification bits is referred to as a soft bit mode decoding.

Figure 13:
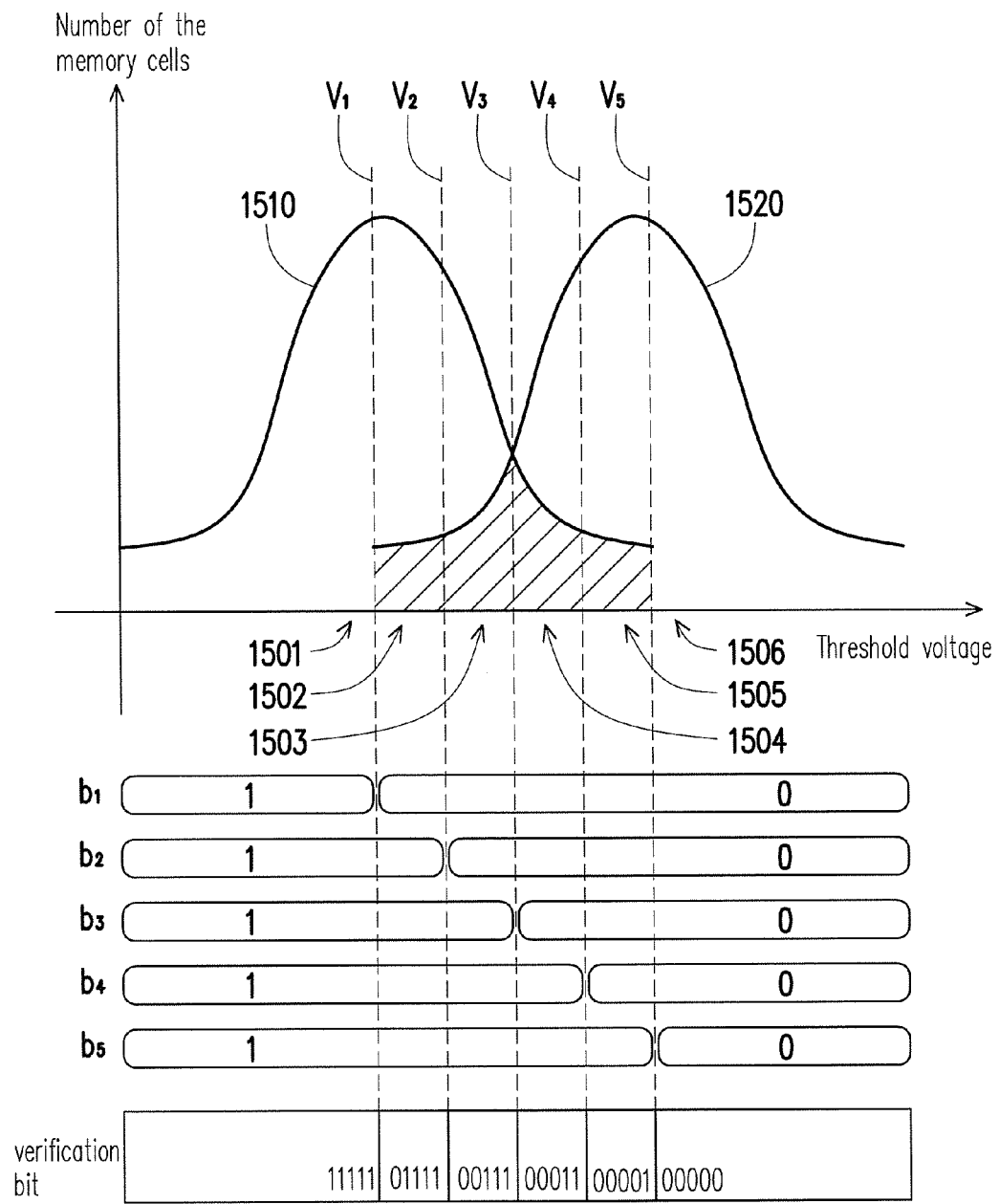
FIG. 13 illustrates a schematic diagram of reading a verification bit according to an exemplary embodiment.

FIG. 13 illustrates a schematic diagram of reading a verification bit according to an exemplary embodiment. Referring to FIG. 13, it is assumed that the memory cell in a storage status 1510 stores the bit "1", and the memory cell in a storage status 1520 stores the bit "0". The storage status 1510 may be partially overlapped with the storage status 1520, namely, under some specific read voltages, a part of memory cells in the storage status 1510 may be determined as in the storage status 1520, and a part of memory cells in the storage status 1520 may be determined as in the storage status 1510. When a read voltage is applied to the control gate of the memory cell, the verification bit obtained by the memory management circuit 202 may be "0" or "1" depended on whether the channel of the memory cell is turned on. Hereinafter, it is assumed that the corresponding verification bit is "0" when the channel of the memory cell is not turned on, and otherwise, it is "1". In the present exemplary embodiment, the memory management circuit 202 may apply read voltages $V_1$ to $V_5$ to the memory cells, so as to obtain 5 verification bits. More specifically, the read voltage $V_1$ is corresponding to the verification bit $b_1$; the read voltage $V_2$ is corresponding to the verification bit $b_2$; the read voltage $V_3$ is corresponding to the verification bit $b_3$; the read voltage $V_4$ is corresponding to the verification bit $b_4$; and the read voltage $V_5$ is corresponding to the verification bit $b_5$. The memory management circuit 202 may obtain the verification bit from the verification bit $b_1$ to the verification bit $b_5$ in following manner: when the threshold voltage of one memory cell falls within an interval 1501, the verification bit is "11111"; when the threshold voltage of one memory cell falls within an interval 1502, the verification bit is "01111"; when the threshold voltage of one memory cell falls within an interval 1503, the verification bit is "00111"; when the threshold voltage of one memory cell falls within an interval 1504, the verification bit is "00011"; when the threshold voltage of one memory cell falls within an interval 1505, the verification bit is "00001"; and when the threshold voltage of one memory cell falls within an interval 1506, the verification bit is "00000"

In the present exemplary embodiment, one of the read voltages $V_1$ to $V_5$ is set to a sign read voltage. The sign read voltage is used to decide the data bit. For instance, in case the read voltage $V_3$ is the sign read voltage, the data bit is identical to the verification bit $b_3$; and in case the read voltage $V_2$ is the sign read voltage, the data is identical to the verification bit $b_2$. In each of the intervals, a probability of the memory cell belonging to the storage status 1510 and a probability of the memory cell belonging to the storage status 1520 may both be calculated in advance. Based on the two probabilities, a log likelihood ratio (LLR) may be calculated, and the log likelihood ratio may also be referred to as the channel reliability message of the memory cell in the present exemplary embodiment. In an exemplary embodiment, the log likelihood ratio corresponding to each of the intervals may be calculated and stored in a lookup table in advance. The memory management circuit 202 may input the verification bits $b_1$ to $b_5$ to the lookup table, so as to obtain the corresponding log likelihood ratio to serve as the channel reliability message. Namely, each of the data bits is corresponding to one channel reliability message. The channel reliability messages may be used in the iterative decoding for calculating the reliability message of each of the data bits.

After the data bits and the channel reliability messages of the cell are obtained, the checking circuit 1224 may perform the parity check procedure on the data bits to generate the checks according to a parity check matrix. More specifically, the data bits may constitute a vector r with a dimension of 1-by-n, and the parity check matrix is represented by a matrix H with a dimension of m-by-n. Therein, m and n are positive integers indicating that a n number of data bits includes the error correcting code having a m number of bits. The checking circuit 1224 may multiply the matrix H by a transpose of the vector r to obtain a syndrome vector, and a process thereof may be represented in an equation (1) below.

$$s = H \otimes r^T \quad (1)$$

Therein, $\otimes$ represents a modular 2 matrix multiplication. Each element in a syndrome vector s refers to one check. Next, the checking circuit 1224 may transmit the syndrome vector s and the channel reliability message to the error bit index generating circuit 1226 for performing the iterative decoding.

Figure 14:
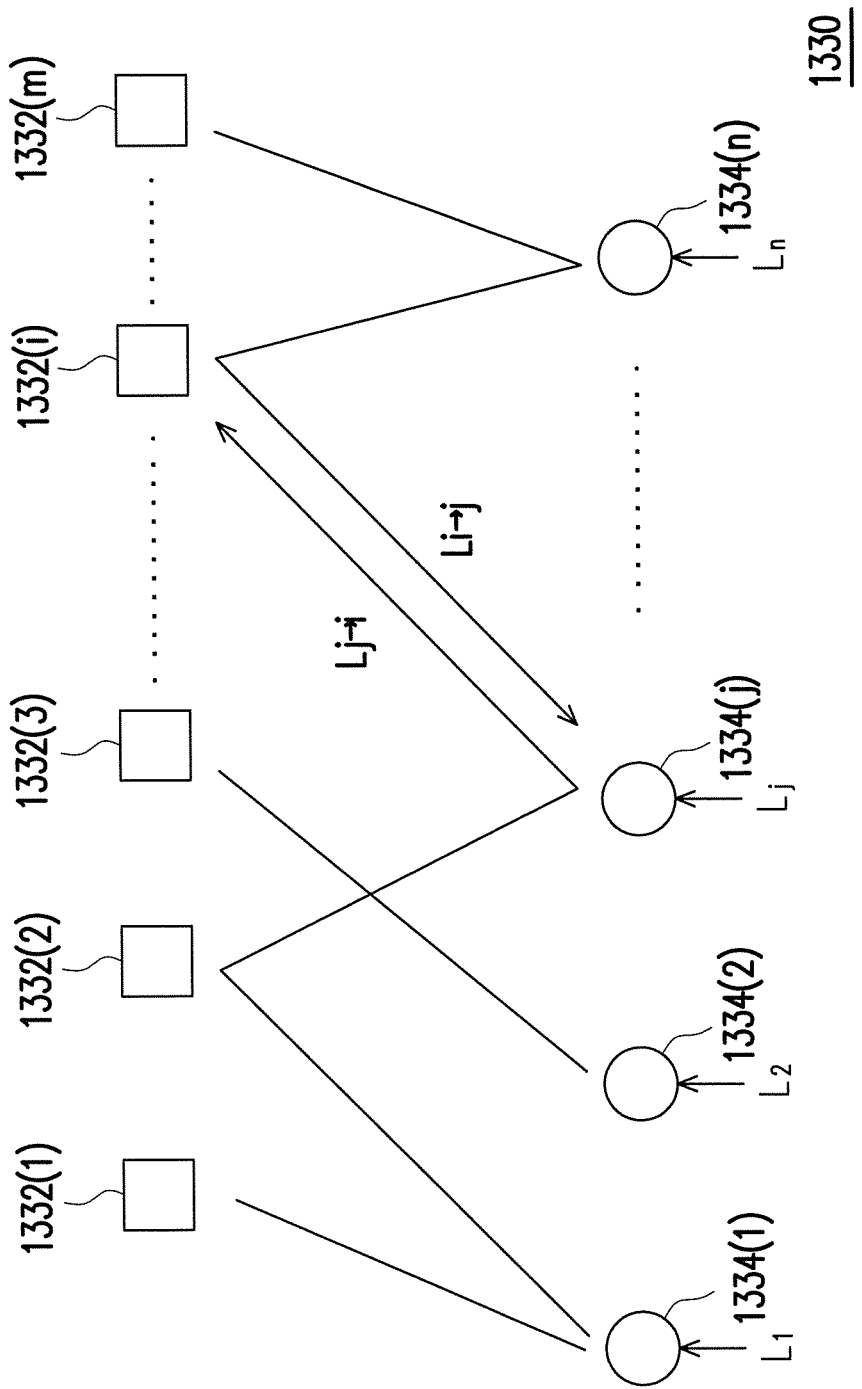
FIG. 14 is a schematic diagram illustrating an iterative decoding according to an exemplary embodiment.

FIG. 14 is a schematic diagram illustrating an iterative decoding according to an exemplary embodiment.

Referring to FIG. 14, generally, the parity check matrix H may be represented by a graph 1330 which includes constraint nodes 1332(1) to 1332(m) and variable nodes 1334(1) to 1334(n). Each of the constraint nodes 1332(1) to 1332(m) is corresponding to one check, and each of the variable nodes 1334(1) to 1334(n) is corresponding to one data bit. Corresponding relations between the data bits and the checks (i.e., connecting relation between the variable nodes 1334(1) to 1334(n) and the constraint nodes 1332(1) to 1332(m)) is generated according to the parity check matrix. More specifically, in case an element at a $i^{th}$ row and a $j^{th}$ column is 1, a $i^{th}$ constraint node 1332(i) is connected to a $j^{th}$ variable node 1332(j), in which i and j are positive integers. In other words, each of the constraint nodes is connected to one or more variable nodes, and each of the variable nodes is also connected to one or more constraint nodes. On the other hand, each of the variable nodes also receives the channel reliability message mentioned above. For instance, the variable node 1332(1) may receive a channel reliability message $L_1$ from a first one of the first memory cells, and the variable node 1332(j) may receive a channel reliability message $L_j$ from a $j^{th}$ one of the first memory cells.

In the iterative decoding, the reliability messages are transmitted along edges in the graph 1330. For instance, the reliability message $L_{i \to j}$ is transmitted from the constraint node 1332(i) to the variable node 1332(j), and the reliability message $L_{j \to i}$ is transmitted from the variable node 1332(j) to the constraint node 1332(i). These reliability messages are used to represent probabilities of one specific data bit to be decoded into "1" or "0", which are considered by one node. The variable nodes 1334(1) to 1334(n) and the constraint nodes 1332(1) to 1332(m) may calculate reliability messages to be outputted according to the reliability message being inputted, which is similar to that in calculating the conditional probabilities of one specific data bit to be decoded into "1" or "0". Herein, the reliability messages transmitted from the variable nodes 1334(1) to 1334(n) to the constraint nodes 1332(1) to 1332(m) are also referred to as variable-to-constraint reliability messages, and the reliability messages transmitted from the constraint nodes 1332(1) to 1332(m) to the variable nodes 1334(1) to 1334(n) are referred to as constraint-to-variable reliability messages. In other words, each of the data bits is corresponding to some variable-to-constraint reliability messages according to the parity check matrix, and each of the checks is corresponding to some constraint-to-variable reliability messages according to the parity check matrix. Since the variable nodes 1334(1) to 1334(n) and the constraint nodes 1332(1) to 1332(m) are used to describe the iterative decoding, and a data structure such as the graph 1330 may not necessarily be established by the error bit index generating circuit 1226, hereinafter, the reliability messages $L_{i \to j}$ may be referred to as the constraint-to-variable reliability messages corresponding from a $i^{th}$ check to a $j^{th}$ data bit, and the reliability messages $L_{j \to i}$ may be referred to the variable-to-constraint reliability messages corresponding from the $j^{th}$ data bit to the $i^{th}$ check.

In the present exemplary embodiment, the error bit index generating circuit 1226 may update the constraint-to-variable reliability messages corresponding to each of the checks according to the variable-to-constraint reliability messages and the checks. In a first iteration of the iterative decoding, the variable-to-constraint reliability messages corresponding to each of the data bits are the channel reliability messages of the data bits itself. Since the checks are used to indicate those data bits not passing the constraint nodes, the checks may also be used for adjusting the probabilities of one specific data bit to be decoded into "1" or "0". For instance, in case one data bit is "0", and the checks corresponding to such data bit is "1", the probability of one specific data bit to be decoded into 1 may then be increased. However, a method for updating the constraint-to-variable reliability messages according to the checks is not particularly limited in the invention. For instance, steps for updating the constraint-to-variable reliability messages may be represented by equations (2) to (5) below.

$$L_{i \to j} = (-2S_i + 1) \times \prod_{j' \in N(i)-\{j\}} \alpha_{j'i} \times \varphi\left( \sum_{j' \in N(i)-\{j\}} \varphi(\beta_{j'i}) \right) \quad (2)$$

$$\varphi(x) = -\log\left(\tanh\left(\frac{x}{2}\right)\right) = \log\left(\frac{e^x + 1}{e^x - 1}\right) \quad (3)$$

$$\alpha_{ji} = \text{sign}(L_{j \to i}) \quad (4)$$

$$\beta_{ji} = |L_{j \to i}| \quad (5)$$

$S_i$ is the $i^{th}$ check. N(i) is the data bit (indicated as all the variable nodes connected to the constraint node 1332(i)) corresponding to the $i^{th}$ check. {j} is a set defined by the $j^{th}$ data bit. In the first iteration, the variable-to-constraint reliability messages $L_{j \to i}$ are identical to the channel reliability message $L_j$. Next, the error bit index generating circuit 1226 may update the variable-to-constraint reliability messages corresponding to each of the data bits according to the constraint-to-variable reliability messages. For instance, steps for updating the variable-to-constraint reliability messages may be represented by an equation (6) below.

$$L_{j \to i} = L_j + \sum_{i' \in N(j)} L_{i' \to j} \quad (6)$$

The error bit index generating circuit 1226 may add the constraint-to-variable reliability messages corresponding to each of the data bits to the channel reliability messages for obtaining the reliability message of each of the data bits. For instance, steps for obtaining the reliability message may be represented by an equation (7) below.

$$L_j^{tot} = L_j + \sum_{i \in N(i)} L_{i \to j} \quad (7)$$

$L_j^{tot}$ is the reliability message of the $j^{th}$ data bit. Next, the error bit index generating circuit 1226 may determine whether the reliability message of each of the data bits matches a threshold to decide the error bit and obtain an error index vector, and the length of the error index vector is equal to the length of the codeword. For instance, steps for obtaining the error index vector may be represented by an equation (8) below.

$$e_j = \begin{cases} 1 & \text{if } L_j^{tot} < 0 \\ 0 & \text{otherwise} \end{cases} \quad (8)$$

e is an error index vector which includes $e_1$ to $e_n$. $e_j$ represents a $j^{th}$ index in the error index vector. In case $e_j$ is equal to 1, it indicates that the $j^{th}$ data bit in the codeword is the error bit.

Lastly, the error bit index generating circuit 1226 may perform a modular-2 multiplication on the parity check matrix and the error index vector to obtain a first vector, and determine whether the first vector is identical to the vector generated by the checks. In case the first vector is identical to the vector generated by the checks, the error bit index generating circuit 1226 determines that the parity criteria are complied with, stops the iterative decoding, and outputs the index of the error bit. In other words, the iterative decoding is stopped when an equation (9) below are complied with. Nonetheless, in case the equation (9) below is not complied with, the error bit index generating circuit 1226 may perform a next iteration, namely, the equation (2) to (8) are repeated.

$$H \otimes e = s \quad (9)$$

Third Exemplary Embodiment

Hereinafter, only differences between third embodiment and second embodiment are described below. In third exemplary embodiment, the memory management circuit 202 may obtain the verification bit of the memory cell by only using one read voltage. The iterative decoding preformed in this case is referred to as a hard bit mode decoding. Furthermore, in third exemplary embodiment, the number of the channel reliability message is one. More specifically, after reading a verification bit of each of the first memory cells according to a read voltage, the memory management circuit 202 may obtain a log likelihood ratio of each of the first memory cells according to the corresponding verification bit. The memory management circuit 202 may also calculate an average value of the log likelihood ratios of the first memory cells to serve as the channel reliability message, namely, all of the data bits are corresponding to the same channel reliability message.

In a first iteration of third exemplary embodiment, regardless of what values of i and j are, all the corresponding variable-to-constraint reliability messages $L_{j \to i}$ are the channel reliability message (hereinafter, marked as $L_r$), and steps for updating the constraint-to-variable reliability messages are the same to above said equations (2) to (5). However, the equations (6) and (7) may be re-written as equations (10) and (11) listed below:

$$L_{j \to i} = L_r + \sum_{i' \in N(j)} L_{i' \to j} \quad (10)$$

$$L_j^{tot} = L_r + \sum_{i \in N(i)} L_{i \to j} \quad (11)$$

In addition, steps for obtaining the error index vector and determining whether the index of the error bit and the checks comply with a parity criteria are the same to above-said equations (8) and (9), thus related descriptions thereof are omitted hereinafter.

Fourth Exemplary Embodiment

In fourth exemplary embodiment, the equation (2) may be approached by calculating with a minimal value. More specifically, steps for updating the constraint-to-variable reliability messages may be represented by an equation (12), and the equations (4) and (5).

$$L_{i \to j} = (-2S_i + 1) \times \prod_{j' \in N(i) - \{j\}} \alpha_{j'i} \times \min_{j' \in N(i) - \{j\}} \beta_{j'i} \quad (12)$$

$$\alpha_{ji} = \text{sign}(L_{j \to i}) \quad (4)$$

$$\beta_{ji} = |L_{j \to i}| \quad (5)$$

Steps for updating the variable-to-constraint, calculating the reliability messages, obtaining the index vector, and determining whether the parity criteria are complied with, are all the same to that described in second exemplary embodiment, thus related descriptions are omitted hereinafter. It should be noted that, the equation (12) may be used in the hard bit mode or the soft bit mode, and the invention is not limited thereto.

Fifth Exemplary Embodiment

In fifth exemplary embodiment, when the reliability messages are calculated according to the checks, the error bit index generating circuit 1226 multiplies the vector generated by the checks by the parity check matrix to obtain a vector (also known as a first vector), which may be represented by an equation (13) below.

$$f = s^T \cdot H \quad (13)$$

f is the first vector having a dimension being 1-by-n, and including the reliability message of each of the data bits. It should be noted that, a multiplication used in the equation (13) is an ordinary matrix multiplication instead of the modular 2 matrix multiplication. Accordingly, in case a value of one element in the vector f gets greater, it indicates that an error probability for that data bit is greater.

Next, the error bit index generating circuit 1226 may decide the index of the error bit according to one of elements in the vector f having a maximal value. Hereinafter, it is assumed that, the $e^{th}$ element in the vector f has the maximal value, in which e is an positive integer. When it comes to determine whether the checks and the index of the error bit comply with the parity criteria, according to the index e, the error bit index generating circuit 1226 may select a $e^{th}$ column (also known as an error correction column) from a plurality of columns in the parity check matrix H, and updates the checks according to such $e^{th}$ column. For instance, steps for updating the checks may be represented by an equation (14) below.

$$s = s \oplus h_e \quad (14)$$

$h_e$ is a $e^{th}$ column in the parity check matrix H. $\oplus$ represents a modular 2 addition. Lastly, the error bit index generating circuit 1226 determines whether the vector generated by the checks after being updated is a zero vector. In case the vector generated by the checks after being updated is the zero vector (i.e., all of the elements in the vector s is 0), the error bit index generating circuit 1226 determines that the parity criteria are complied with, stops the iterative decoding, and outputs the indexes e generated in each of the iteration. In case the vector generated by the checks after being updated is not the zero vector, the error bit index generating circuit 1226 performs the next iteration, namely, the equations (13) to (14) are repeated.

Sixth Exemplary Embodiment

Figure 15:
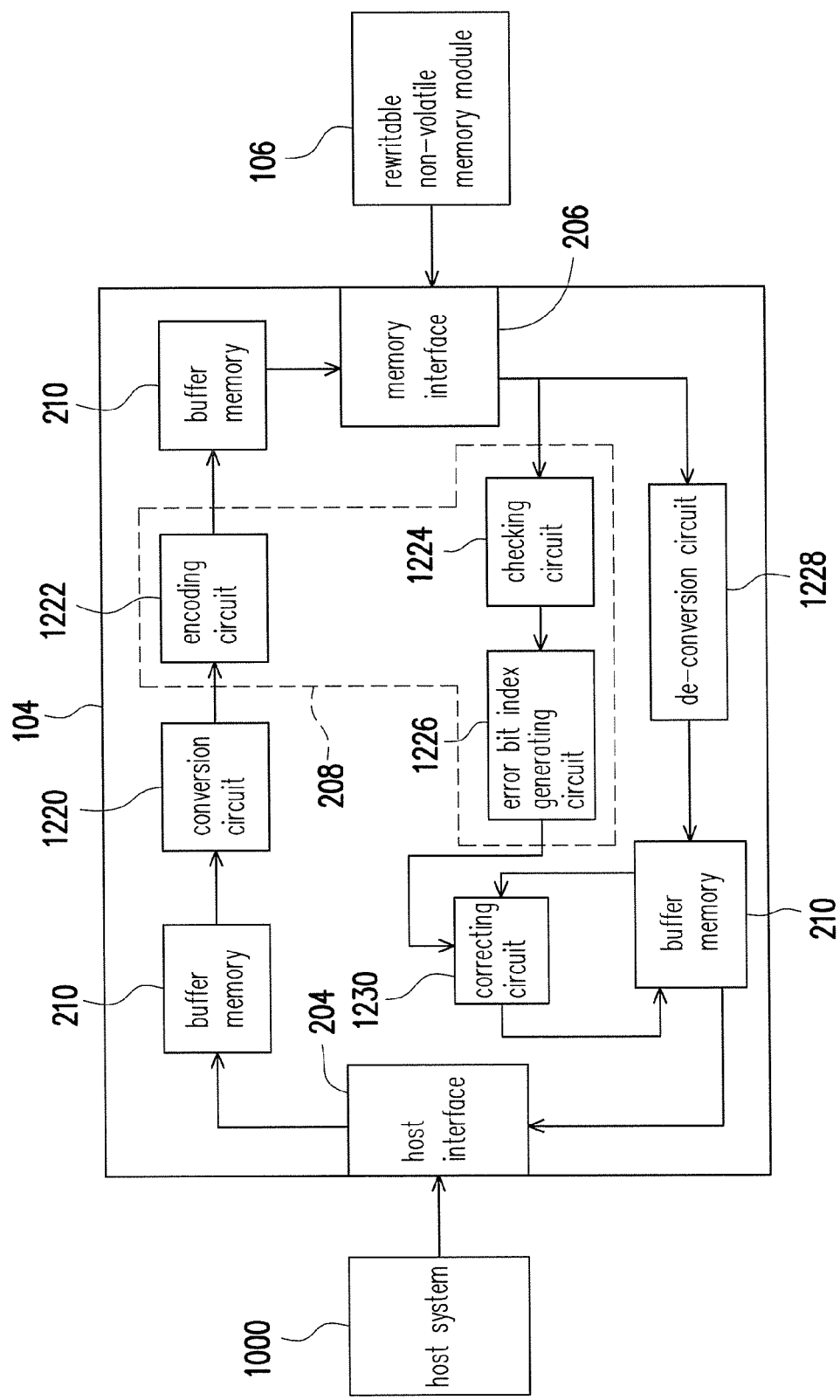
FIG. 15 is a schematic diagram illustrating operations of a memory controlling circuit unit according to sixth exemplary embodiment.

FIG. 15 is a schematic diagram illustrating operations of a memory controlling circuit unit according to sixth exemplary embodiment.

Referring to FIG. 15, unlike FIG. 12, after the data bits arranged in sequence are updated by the connecting circuit 1230 according to the index of the error bit, the corrected data bits are again temporarily stored in the buffer memory 210. Thereafter, the memory management circuit 202 may then transmit the data bits stored in the buffer memory 210 to the host system 1000 through the host interface 204. It should be noted that, the method of FIG. 15 may be used with reference to second to fifth exemplary embodiments described above, but the invention is not limited thereto.

Figure 16:
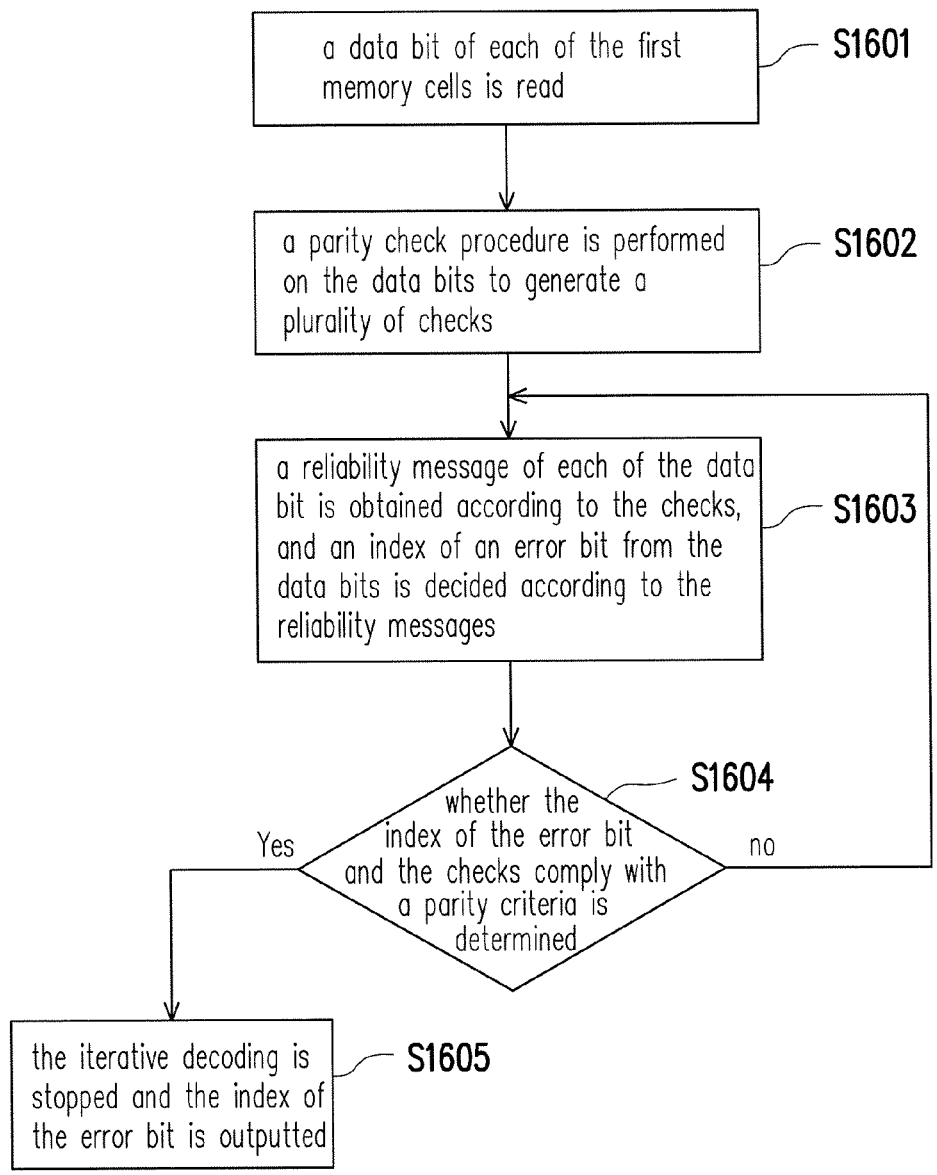
FIG. 16 is a flowchart illustrating a decoding method according to an exemplary embodiment.

FIG. 16 is a flowchart illustrating a decoding method according to an exemplary embodiment.

Referring to FIG. 16, in step S1601, a data bit of each of the first memory cells is read. In step S1602, a parity check procedure is performed on the data bits to generate a plurality of checks. In step S1603, a reliability message of each of the data bit is obtained according to the checks, and an index of an error bit from the data bits is decided according to the reliability messages. In step S1604, whether the index of the error bit and the checks comply with a parity criteria are determined. If the parity criteria are complied with, in step S1605, the iterative decoding is stopped and the index of the error bit is outputted. If the parity criteria are not complied with, return back to step S1603, and a next iteration is performed. In an exemplary embodiment, whether the number of iterations in the iterative decoding exceeds a preset number of iterations is also determined in step S1604. In case the parity criteria are complied with or the number of iterations exceeds the preset number of iterations, proceeding to step S1605. Otherwise, return to step S1603.

Nevertheless, steps depicted in FIG. 16 are described in detail as above, thus related description is omitted hereinafter. It should be noted that, the steps depicted in FIG. 16 may be implemented as a plurality of program codes or circuits.

However, the invention is not limited thereto. In addition, the method disclosed in FIG. 16 can be used accompanying the foregoing exemplary embodiments, or can be used separately, and the invention is not limited thereto.

Figure 17:
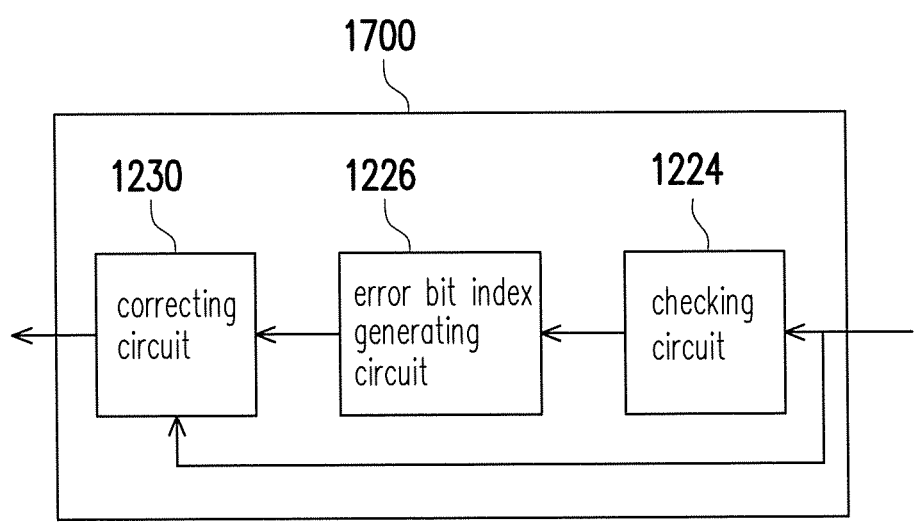
FIG. 17 is a schematic diagram illustrating an example of a decoding circuit for low density parity code according to an exemplary embodiment.

FIG. 17 is a schematic diagram illustrating an example of a decoding circuit for low density parity code according to an exemplary embodiment.

Referring to FIG. 17, a decoding circuit 1700 for low density parity code includes the checking circuit 1224, the error bit index generating circuit 1226 and the correcting circuit 1230. Therein, the checking circuit 1224, the error bit index generating circuit 1226 and the correcting circuit 1230 have been described in the foregoing embodiments, thus related descriptions are omitted hereinafter. In the present exemplary embodiment, the decoding circuit 1700 for low density parity code is disposed in the memory controlling circuit unit 104 to become a part of the error checking and correcting circuit 208, as shown in FIG. 12 and FIG. 15. However, in other exemplary embodiments, the decoding circuit 1700 for low density parity code may also be disposed in the rewritable non-volatile memory module 106, such that the data bits after being corrected may be read by the memory controlling circuit unit 104 from the rewritable non-volatile memory module 106. A place where the decoding circuit 1700 being disposed is not particularly limited in the invention.

In view of above, a decoding method, a memory storage device, a memory controlling circuit unit and a decoding circuit for a low density parity code according to the exemplary embodiments of the invention are capable of performing the iterative decoding according to the checks instead of the entire codeword. Since an amount of the data required by the iterative decoding is decreased, it is not necessary to temporarily store the data in the buffer memory 210. As a result, a time required for reading the data from the buffer memory 210 may be saved (i.e., a decoding latency is decreased) and demands for bandwidth of the buffer memory 210 may also be reduced. Moreover, the de-conversion circuit 1228 may operate together with the error checking and correcting circuit 208 at the same time, so as to reduce demands for bandwidth of the de-conversion circuit 1228.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method for low density parity code, and for a rewritable non-volatile memory module, wherein the rewritable non-volatile memory module comprises a plurality of first memory cells, and the decoding method comprises:
    reading a data bit of each of the first memory cells;
    performing a parity check procedure on the data bits to generate a plurality of checks;
    in an iterative decoding of the low density parity code, obtaining reliability message of each of the data bits according to the checks, and deciding an index of an error bit from the data bits according to the reliability messages, wherein the index of the error bit comprises at least one of a first index of a first error bit and a second index of a second error bit, wherein the first error bit corresponding to the first index is different from the second error bit corresponding to the second index in an arrangement of the data bits;
    determining whether the index of the error bit and the checks comply with a parity criteria; and
    if the index of the error bit and the checks comply with the parity criteria, stopping the iterative decoding, and correcting the data bit according to the index of the error bit, wherein the first index is used to correct the first error bit, and the second index is used to correct the second error bit.

2. The decoding method of claim 1, wherein the parity check procedure is performed according to a parity check matrix, corresponding relations between the data bits and the checks are generated according to the parity check matrix, each of the data bits is corresponding to a plurality of variable-to-constraint reliability messages according to the parity check matrix, each of the checks is corresponding to a plurality of constraint-to-variable reliability messages according to the parity check matrix, and obtaining the reliability message of each of the data bits according to the checks comprises:
    updating the constraint-to-variable reliability messages corresponding to each of the checks according to the variable-to-constraint reliability messages and the checks, wherein in a first iteration of the iterative decoding, the variable-to-constraint reliability messages corresponding to each of the data bits is identical to one of at least one channel reliability message;
    updating the variable-to-constraint reliability messages corresponding to each of the data bits according to the constraint-to-variable reliability messages; and
    calculating the reliability message of each of the data bits according to the constraint-to-variable reliability messages and the at least one channel reliability message.

3. The decoding method of claim 2, wherein the number of the at least one channel reliability message is equal to 1, and the decoding method further comprises:
    reading a verification bit of each of the first memory cells according to a read voltage;
    obtaining a log likelihood ratio of each of the first memory cells according to the verification bits; and
    calculating an average value of the log likelihood ratios of the first memory cells to serve as the channel reliability message.

4. The decoding method of claim 2, wherein the number of the at least one channel reliability message is greater than 1, and the decoding method further comprises:
    reading a plurality of verification bits of each of the first memory cells according to a plurality of read voltages; and
    obtaining a log likelihood ratio of each of the first memory cells to serve as the channel reliability message according to the verification bits of each of the first memory cells.

5. The decoding method of claim 2, wherein the step of calculating the reliability message of each of the data bits according to the constraint-to-variable reliability messages and the at least one channel reliability message comprises:
    adding the constraint-to-variable reliability messages corresponding to each of the data bits to one of the at least one channel reliability message for obtaining the reliability message of each of the data bits,
    wherein the step of deciding the index of the error bit from the data bits according to the reliability messages comprises:
    determining whether the reliability message of each of the data bits matches a critical value to decide the error bit and obtain an error index vector, wherein the step of determining whether the index of the error bit and the checks comply with the parity criteria comprises:
performing a modular 2 multiplication on the parity check matrix and the error index vector to obtain a first vector;
determining whether the first vector is identical to a vector generated by the checks; and
if the first vector is identical to the vector generated by the checks, determining that the parity criteria are complied with.

6. The decoding method of claim 5, wherein the constraint-to-variable reliability message is updated according to equations (1) to (4) below:

$$L_{i \to j} = (-2S_i + 1) \times \prod_{j' \in N(i)-\{j\}} \alpha_{j'i} \times \varphi\left(\sum_{j' \in N(i)-\{j\}} \varphi(\beta_{j'i})\right) \quad (1)$$

$$\varphi(x) = -\log\left(\tanh\left(\frac{x}{2}\right)\right) = \log\left(\frac{e^x + 1}{e^x - 1}\right) \quad (2)$$

$$\alpha_{ji} = \text{sign}(L_{j \to i}) \quad (3)$$

$$\beta_{ji} = |L_{j \to i}| \quad (4)$$

wherein $L_{i \to j}$ is the constraint-to-variable reliability message corresponding from a ith check among the checks to a jth data bit among the data bits, Si is the ith check, N(i) is the data bit among the data bits corresponding to the ith check, {j} is a set defined by the jth data bit, $L_{j \to i}$ is the variable-to-constraint reliability message corresponding from the jth data bit to the ith check, and i and j are positive integers.

7. The decoding method of claim 5, wherein the constraint-to-variable reliability message is updated according to equations (1) to (3) below:

$$L_{i \to j} = (-2S_i + 1) \times \prod_{j' \in N(i)-\{j\}} \alpha_{j'i} \times \min_{j' \in N(i)-\{j\}} \beta_{j'i} \quad (1)$$

$$\alpha_{ji} = \text{sign}(L_{j \to i}) \quad (2)$$

$$\beta_{ji} = |L_{j \to i}| \quad (3)$$

wherein $L_{i \to j}$ is the constraint-to-variable reliability message corresponding from a ith check among the checks to a jth data bit among the data bits, Si is the ith check, N(i) is the data bit among the data bits corresponding to the ith check, {j} is a set defined by the jth data bit, $L_{j \to i}$ is the variable-to-constraint reliability message corresponding from the jth data bit to the ith check, and i and j are positive integers.

8. The decoding method of claim 1, wherein the parity check procedure is performed according to a parity check matrix, and the step of obtaining the reliability message of each of the data bits according to the checks comprises:
multiplying a vector generated by the checks by the parity check matrix to obtain a first vector, wherein the first vector comprises the reliability messages of the data bits,
wherein the step of deciding the index of the error bit from the data bits according to the reliability messages comprises:
deciding the index of the data bit according to one of elements in the first vector having a maximal value, wherein the step of determining whether the index of the error bit and the checks comply with the parity criteria comprises:
selecting an error correction column from the parity check matrix according to the index of the error bit;
updating the checks according to the error correction column; and
if the vector generated by the checks after being updated is a zero vector, determining that the checks comply with the parity criteria.

9. The decoding method of claim 1, further comprising:
changing the data bits into the data bits arranged in sequence, wherein the step of correcting the data bits according to the index of the error bit is performed on the data bits arranged in sequence; and
transmitting the data bits after being corrected to a host system.

10. A memory storage device, comprising:
a connection interface unit configured to couple to a host system;
a rewritable non-volatile memory module comprising a plurality of first memory cells; and
a memory controlling circuit unit coupled to the connection interface unit and the rewritable non-volatile memory module, and configured to execute a plurality of steps that comprise:
reading a data bit of each of the first memory cells;
performing a parity check procedure on the data bits to generate a plurality of checks;
in an iterative decoding of the low density parity code, obtaining a reliability message of each of the data bits according to the checks, and deciding an index of an error bit from the data bits according to the reliability messages, wherein the index of the error bit comprises at least one of a first index of a first error bit and a second index of a second error bit, wherein the first error bit corresponding to the first index is different from the second error bit corresponding to the second index in an arrangement of the data bits;
determining whether the index of the error bit and the checks comply with a parity criteria; and
if the index of the error bit and the checks comply with the parity criteria, stopping the iterative decoding, and correcting the data bit according to the index of the error bit, wherein the first index is used to correct the first error bit, and the second index is used to correct the second error bit.

11. The memory storage device of claim 10, wherein the parity check procedure is performed according to a parity check matrix, corresponding relations between the data bits and the checks are generated according to the parity check matrix, each of the data bits is corresponding to a plurality of variable-to-constraint reliability messages according to the parity check matrix, each of the checks is corresponding to a plurality of constraint-to-variable reliability messages according to the parity check matrix, and the step of obtaining the reliability message of each of the data bits according to the checks comprises:
updating the constraint-to-variable reliability messages corresponding to each of the checks according to the variable-to-constraint reliability messages and the checks, wherein in a first iteration of the iterative decoding, the variable-to-constraint reliability messages corresponding to each of the data bits is identical to one of at least one channel reliability message;

updating the variable-to-constraint reliability messages corresponding to each of the data bits according to the constraint-to-variable reliability messages; and calculating the reliability message of each of the data bits according to the constraint-to-variable reliability messages and the at least one channel reliability message.

12. The memory storage device of claim 11, wherein the number of the at least one channel reliability message is equal to 1, and the steps further comprise:

reading a verification bit of each of the first memory cells according to a read voltage;

obtaining a log likelihood ratio of each of the first memory cells according to the verification bits; and calculating an average value of the log likelihood ratios of the first memory cells to serve as the channel reliability message.

13. The memory storage device of claim 11, wherein the number of the at least one channel reliability message is greater to 1, and the steps further comprise:

reading a plurality of verification bits of each of the first memory cells according to a plurality of read voltages; and obtaining a log likelihood ratio of each of the first memory cells to serve as the channel reliability message according to the verification bits of each of the first memory cells.

14. The memory storage device of claim 11, wherein the step of calculating the reliability message of each of the data bits according to the constraint-to-variable reliability messages and the at least one channel reliability message comprises:

adding the constraint-to-variable reliability messages corresponding to each of the data bits to the one of the at least one channel reliability message for obtaining the reliability message of each of the data bits, wherein the step of deciding the index of the error bit from the data bits according to the reliability messages comprises:

determining whether the reliability message of each of the data bits matches a critical value to decide the error bit and obtain an error index vector, wherein the step of determining whether the index of the error bit and the checks comply with the parity criteria comprises:

performing a modular 2 multiplication on the parity check matrix and the error index vector to obtain a first vector;

determining whether the first vector is identical to a vector generated by the checks; and if the first vector is identical to the vector generated by the checks, determining that the parity criteria are complied with.

15. The memory storage device of claim 14, wherein the constraint-to-variable reliability message is updated according to equations (1) to (4) below:

$$L_{i \to j} = (-2S_i + 1) \times \prod_{j' \in N(i)-\{j\}} \alpha_{j'i} \times \varphi\left(\sum_{j' \in N(i)-\{j\}} \varphi(\beta_{j'i})\right) \quad (1)$$

$$\varphi(x) = -\log\left(\tanh\left(\frac{x}{2}\right)\right) = \log\left(\frac{e^x+1}{e^x-1}\right) \quad (2)$$

$$\alpha_{ji} = \text{sign}(L_{j \to i}) \quad (3)$$

$$\beta_{ji} = |L_{j \to i}| \quad (4)$$

wherein $L_{i \to j}$ is the constraint-to-variable reliability message corresponding from a ith check among the checks to a jth data bit among the data bits, Si is the ith check, N(i) is the data bit among the data bits corresponding to the ith check, {j} is a set defined by the jth data bit, $L_{j \to i}$ is the variable-to-constraint reliability message corresponding from the jth data bit to the ith check, and i and j are positive integers.

16. The memory storage device of claim 14, wherein the constraint-to-variable reliability message is updated according to equations (1) to (3) below:

$$L_{i \to j} = (-2S_i + 1) \times \prod_{j' \in N(i)-\{j\}} \alpha_{j'i} \times \min_{j' \in N(i)-\{j\}} \beta_{j'i} \quad (1)$$

$$\alpha_{ji} = \text{sign}(L_{j \to i}) \quad (2)$$

$$\beta_{ji} = |L_{j \to i}| \quad (3)$$

wherein $L_{i \to j}$ is the constraint-to-variable reliability message corresponding from a ith check among the checks to a jth data bit among the data bits, Si is the ith check, N(i) is the data bit among the data bits corresponding to the ith check, {j} is a set defined by the jth data bit, $L_{j \to i}$ is the variable-to-constraint reliability message corresponding from the jth data bit to the ith check, and i and j are positive integers.

17. The memory storage device of claim 10, wherein the parity check procedure is performed according to a parity check matrix, and the step of obtaining the reliability message of each of the data bits according to the checks comprises:

multiplying a vector generated by the checks by the parity check matrix to obtain a first vector, wherein the first vector comprises the reliability messages of the data bits, wherein the step of deciding the index of the error bit from the data bits according to the reliability messages comprises:

deciding the index of the data bit according to one of elements in the first vector having a maximal value, wherein the step of determining whether the index of the error bit and the checks comply with the parity criteria comprises:

selecting an error correction column from the parity check matrix according to the index of the error bit;

updating the checks according to the error correction column; and if the vector generated by the checks after being updated is a zero vector, determining that the checks comply with the parity criteria.

18. The memory storage device of claim 10, wherein the memory controlling circuit unit is further configured to change the data bits into the data bits arranged in sequence, and store the data bits arranged in sequence in a buffer memory, wherein the step of updating the data bits unit is performed on the data bits arranged in sequence by the memory controlling circuit, and the memory controlling circuit unit is configured to transmit the data bits after being corrected to the host system.

19. The memory storage device of claim 18, wherein the data bits after being corrected are temporarily stored in the buffer memory before transmitted to the host system.

20. A memory controlling circuit unit, configured to control a rewritable non-volatile memory module, wherein the rewritable non-volatile memory module comprises a plurality of first memory cells, and the memory controlling circuit unit comprises:
- a host interface configured to couple to a host system;
- a memory interface configured to couple to the rewritable non-volatile memory module;
- a memory management circuit coupled to the host interface and the memory interface, and configured to read a data bit of each of the first memory cells;
- a correcting circuit; and
- an error checking and correcting circuit configured to perform a plurality of steps that comprise:
  - performing a parity check procedure on the data bits to generate a plurality of checks;
  - in an iterative decoding of the low density parity code, obtaining a reliability message of each of the data bits according to the checks, and deciding an index of an error bit from the data bits according to the reliability messages, wherein the index of the error bit comprises at least one of a first index of a first error bit and a second index of a second error bit, wherein the first error bit corresponding to the first index is different from the second error bit corresponding to the second index in an arrangement of the data bits;
  - determining whether the index of the error bit and the checks comply with a parity criteria; and
  - if the index of the error bit and the checks comply with the parity criteria, stopping the iterative decoding, wherein the first index is used to correct the first error bit, and the second index is used to correct the second error bit,
  - wherein the correcting circuit is configured to correct the data bit according to the index of the error bit.

21. The memory controlling circuit unit of claim 20, wherein the error checking and correcting circuit comprises a checking circuit and an error bit index generating circuit, performing the parity check procedure to generate the checks is performed by the checking circuit according to a parity check matrix, corresponding relations between the data bits and the checks are generated according to the parity check matrix, each of the data bits is corresponding to a plurality of variable-to-constraint reliability messages according to the parity check matrix, and each of the checks is corresponding to a plurality of constraint-to-variable reliability messages according to the parity check matrix,
wherein the step of obtaining the reliability message of each of the data bits according to the checks is performed by the error bit index generating circuit, and comprises:
updating the constraint-to-variable reliability messages corresponding to each of the checks according to the variable-to-constraint reliability messages and the checks, wherein in a first iteration of the iterative decoding, the variable-to-constraint reliability messages corresponding to each of the data bits is identical to one of at least one channel reliability message;
updating the variable-to-constraint reliability messages corresponding to each of the data bits according to the constraint-to-variable reliability messages; and
calculating the reliability message of each of the data bits according to the constraint-to-variable reliability messages and the at least one channel reliability message.

22. The memory controlling circuit unit of claim 21, wherein the number of the at least one channel reliability message is equal to 1, and the memory management circuit is further configured to read a verification bit of each of the first memory cells according to a read voltage, obtain a log likelihood ratio of each of the first memory cells according to the verification bits, and calculate an average value of the log likelihood ratios of the first memory cells to serve as the channel reliability message.

23. The memory controlling circuit unit of claim 21, wherein the number of the at least one channel reliability message is greater than 1, and the memory management circuit is further configured to read a plurality of verification bits of each of the first memory cells according to a plurality of read voltages, and obtain a log likelihood ratio of each of the first memory cells to serve as the channel reliability message according to the verification bits of each of the first memory cells.

24. The memory controlling circuit unit of claim 21, wherein the step of calculating the reliability message of each of the data bits according to the constraint-to-variable reliability messages and the at least one channel reliability message comprises:
adding the constraint-to-variable reliability messages corresponding to each of the data bits to the one of the at least one channel reliability message for obtaining the reliability message of each of the data bits,
wherein the step of deciding the index of the error bit from the data bits according to the reliability messages is performed by the error bit index generating circuit, and comprises:
determining whether the reliability message of each of the data bits complies with a critical value to decide the error bit and obtain an error index vector,
wherein the step of determining whether the index of the error bit and the checks comply with the parity criteria comprises:
performing a modular 2 multiplication on the parity check matrix and the error index vector to obtain a first vector;
determining whether the first vector is identical to a vector generated by the checks; and
if the first vector is identical to the vector generated by the checks, determining that the parity criteria are complied with.

25. The memory controlling circuit unit of claim 24, wherein the constraint-to-variable reliability message is updated according to equations (1) to (4) below:

$$L_{i \to j} = (-2S_i + 1) \times \prod_{j' \in N(i)-\{j\}} \alpha_{j'i} \times \varphi\left(\sum_{j' \in N(i)-\{j\}} \varphi(\beta_{j'i})\right) \quad (1)$$

$$\varphi(x) = -\log\left(\tanh\left(\frac{x}{2}\right)\right) = \log\left(\frac{e^x + 1}{e^x - 1}\right) \quad (2)$$

$$\alpha_{ji} = \text{sign}(L_{j \to i}) \quad (3)$$

$$\beta_{ji} = |L_{j \to i}| \quad (4)$$

wherein $L_{i \to j}$ is the constraint-to-variable reliability message corresponding from a $i^{th}$ check among the checks to a data bit among the data bits, Si is the check, N(i) is the data bit among the data bits corresponding to the $i^{th}$ check, {j} is a set defined by the $j^{th}$ data bit, $L^{j \to i}$ is the variable-to-constraint reliability message corresponding to from the $j^{th}$ data bit to the $i^{th}$ check, and i and j are positive integers.

26. The memory controlling circuit unit of claim 24, wherein the constraint-to-variable reliability message is updated according to equations (1) to (3) below:

$$L_{i \to j} = (-2S_i + 1) \times \prod_{j' \in N(i)-\{j\}} \alpha_{j'i} \times \min_{j' \in N(i)-\{j\}} \beta_{j'i} \quad (1)$$

$$\alpha_{ji} = \text{sign}(L_{j \to i}) \quad (2)$$

$$\beta_{ji} = |L_{j \to i}| \quad (3)$$

wherein $L^{i \to j}$ is the constraint-to-variable reliability message corresponding from a $i^{th}$ check among the checks to a $j^{th}$ data bit among the data bits, Si is the $i^{th}$ check, N(i) is the data bit among the data bits corresponding to the ith check, {j} is a set defined by the $j^{th}$ data bit, $L^{j \to i}$ is the variable-to-constraint reliability message corresponding from the $j^{th}$ data bit to the $i^{th}$ check, and i and j are positive integers.

27. The memory controlling circuit unit of claim 20, wherein the error checking and correcting circuit comprises a checking circuit and an error bit index generating circuit, and the step of performing the parity check procedure to generate the checks is performed by the checking circuit according to a parity check matrix, wherein the step of obtaining the reliability message of each of the data bits according to the checks is performed by the error bit index generating circuit, and comprises:

multiplying a vector generated by the checks by the parity check matrix to obtain a first vector, wherein the first vector comprises the reliability messages of the data bits, wherein the step of deciding the index of the error bit from the data bits according to the reliability messages is performed by the error bit index generating circuit, and comprises:

deciding the index of the data bit according to one of elements in the first vector having a maximal value, wherein the step of determining whether the index of the error bit and the checks comply with the parity criteria is performed by the error bit index generating circuit, and comprises:

selecting an error correction column from the parity check matrix according to the index of the error bit;

updating the checks according to the error correction column; and if the vector generated by the checks after being updated is a zero vector, determining that the checks comply with the parity criteria.

28. The memory controlling circuit unit of claim 20, further comprising a de-conversion circuit and a buffer memory, wherein the de-conversion circuit is configured to change the data bits into the data bits arranged in sequence, and store the data bits arranged in sequence in the buffer memory, wherein correcting the data bits is performed on the data bits arranged in sequence by the correcting circuit, and the memory management circuit is configured to transmit the data bits after being corrected to the host system.

29. The memory controlling circuit unit of claim 28, wherein the data bits after being corrected are temporarily stored in the buffer memory before being transmitted to the host system.

30. A decoding circuit for low density parity code, and for a rewritable non-volatile memory module, wherein a plurality of data bits are stored in the rewritable non-volatile memory module, and the decoding circuit for low density parity code comprises:

a checking circuit configured to receive the data bits, and perform a parity check procedure on the data bits to generate a plurality of checks;

an error bit index generating circuit coupled to the checking circuit, and configured to obtain a reliability message of each of the data bits according to the checks, and decide an index of an error bit from the data bits according to the reliability messages, wherein the index of the error bit comprises at least one of a first index of a first error bit and a second index of a second error bit, wherein the first error bit corresponding to the first index is different from the second error bit corresponding to the second index in an arrangement of the data bits; and a correcting circuit coupled to the error bit index generating circuit, and configured to correct the data bit according to the index of the error bit, wherein the first index is used to correct the first error bit, and the second index is used to correct the second error bit.

\* \* \* \* \*